US010996292B2

(12) United States Patent
Raberg

(10) Patent No.: US 10,996,292 B2
(45) Date of Patent: May 4, 2021

(54) MAGNETIC SENSOR CIRCUITS AND SYSTEMS AND METHODS FOR FORMING MAGNETIC SENSOR CIRCUITS

(71) Applicant: Infineon Technologies AG, Neubiberg (DE)

(72) Inventor: Wolfgang Raberg, Sauerlach (DE)

(73) Assignee: Infineon Technologies AG

( * ) Notice: Subject to any disclaimer, the term of this patent is extended or adjusted under 35 U.S.C. 154(b) by 63 days.

(21) Appl. No.: 15/837,736

(22) Filed: Dec. 11, 2017

(65) Prior Publication Data

US 2018/0164387 A1    Jun. 14, 2018

(30) Foreign Application Priority Data

Dec. 13, 2016  (DE) .................... 10 2016 124 234.9
Dec. 8, 2017   (DE) .................... 10 2017 129 346.9

(51) Int. Cl.
*G01R 33/09*    (2006.01)

(52) U.S. Cl.
CPC ................................ *G01R 33/098* (2013.01)

(58) Field of Classification Search
CPC .... G01R 33/09; G01R 33/091; G01R 33/093;
G01R 33/095; G01R 33/098; G01R
33/0023; G01R 33/06; G01R 33/07;
G01R 33/072; G01R 33/075; G01R
33/077
See application file for complete search history.

(56) References Cited

U.S. PATENT DOCUMENTS

| | | | | |
|---|---|---|---|---|
| 4,616,281 | A | 10/1986 | Nakamura | |
| 6,615,155 | B2 * | 9/2003 | Gilboa | A61B 5/06 324/207.17 |
| 6,771,472 | B1 * | 8/2004 | Mao | B82Y 25/00 324/207.21 |
| 7,057,862 | B2 | 6/2006 | Kasiraj et al. | |
| 7,463,026 | B2 | 12/2008 | Sasaki et al. | |
| 2004/0111906 | A1 * | 6/2004 | Abe | B82Y 25/00 33/355 R |
| 2007/0080683 | A1 * | 4/2007 | Bartos | G01D 5/145 324/252 |
| 2008/0191694 | A1 | 8/2008 | Barton et al. | |

(Continued)

FOREIGN PATENT DOCUMENTS

| | | |
|---|---|---|
| CN | 202939205 U | 5/2013 |
| CN | 104931900 A | 9/2015 |

(Continued)

OTHER PUBLICATIONS

Harrison, Dan, "Prevent System Damage Via Fast, Accurate Over-Current Detection", Electronic Design (May 14, 2014), 7 pgs.

*Primary Examiner* — David M Schindler
(74) *Attorney, Agent, or Firm* — Design IP

(57) ABSTRACT

A sensor circuit includes a first magnetoresistor. The first magnetoresistor has a first resistance transfer function. Furthermore, the sensor circuit includes a second magnetoresistor. The second magnetoresistor has a second resistance transfer function. The second resistance transfer function is different from the first resistance transfer function. The first magnetoresistor and the second magnetoresistor are connected in series between a first supply terminal of the sensor circuit and a second supply terminal of the sensor circuit.

27 Claims, 6 Drawing Sheets

(56) References Cited

U.S. PATENT DOCUMENTS

| | | |
|---|---|---|
| 2012/0098533 A1 | 4/2012 | Zimmer et al. |
| 2012/0262164 A1* | 10/2012 | Bartos .................... G01R 33/09 |
| | | 324/252 |
| 2013/0169371 A1* | 7/2013 | Baraduc ................. B82Y 25/00 |
| | | 331/94.1 |
| 2013/0241544 A1* | 9/2013 | Zimmer ............... G01R 33/093 |
| | | 324/252 |
| 2013/0278250 A1* | 10/2013 | Raberg ................... G01R 33/09 |
| | | 324/252 |
| 2015/0185297 A1 | 7/2015 | Zimmer et al. |
| 2017/0059360 A1* | 3/2017 | Zimmer ................... G01D 5/16 |

FOREIGN PATENT DOCUMENTS

| | | |
|---|---|---|
| CN | 105425177 A | 3/2016 |
| DE | 103 42 260 A1 | 4/2005 |
| DE | 10 2013 207159 A1 | 10/2013 |
| DE | 10 2012 208 404 A1 | 11/2013 |
| DE | 10 2014 119 488 A1 | 7/2015 |
| WO | 2013 174542 A1 | 11/2013 |

\* cited by examiner

MAGNETIC SENSOR CIRCUITS AND SYSTEMS AND METHODS FOR FORMING MAGNETIC SENSOR CIRCUITS

FIELD

Examples relate to magnetic sensor circuits and systems as well as to methods for forming magnetic sensor circuits including magneto-resistive structures.

BACKGROUND

Magnetoresistive effects are based on numerous different physical phenomena. All of these phenomena have in common that an electrical resistance of a resistive element is alterable by a magnetic field penetrating the resistive element. Technologies utilizing magnetoresistive effects are sometimes referred to as "xMR technologies", whereby the "x" indicates that a multitude of effects may be addressed here, like the Giant Magneto-Resistive (GMR) effect, the Tunnel MagnetoResistive (TMR) effect, or the Anisotropic Magneto-Resistive (AMR) effect, to mention just a few examples. The xMR effects may be applied in a variety of field-based sensors, for example for measuring revolution, angles, etc.

External effects, such as high magnetic field strengths, imposing on the sensors can however cause inaccuracies in measurements performed by the sensors and can make the sensors operate less reliably. This can be critical especially in applications relevant to safety. Hence, there is a demand to improve the operational reliability and/or the accuracy of magnetic sensors. Such a demand can be covered by embodiments according to this disclosure.

SUMMARY

According to a first aspect of the present disclosure it is provided a sensor circuit. The sensor circuit comprises a first magnetoresistor. The first magnetoresistor has a first resistance transfer function. Furthermore, the sensor circuit comprises a second magnetoresistor. The second magnetoresistor has a second resistance transfer function. The second resistance transfer function is different from the first resistance transfer function. The first magnetoresistor and the second magnetoresistor are connected in series between a first supply terminal of the sensor circuit and a second supply terminal of the sensor circuit.

According to a second aspect of the present disclosure it is provided a magnetic sensor bridge circuit. The magnetic sensor bridge circuit comprises a first magnetoresistive vortex sensor element and a second magnetoresistive vortex sensor element. The first and the second magnetoresistive vortex sensor element are connected in series. Furthermore, the magnetic sensor bridge circuit comprises a third magnetoresistive vortex sensor element and a fourth magnetoresistive vortex sensor element. The third and the fourth magnetoresistive vortex sensor element are connected in series. The first and the third magnetoresistive vortex sensor element are connected to a first supply terminal of the magnetic sensor bridge circuit. The second and the fourth magnetoresistive vortex sensor element are connected to a second, different supply terminal of the magnetic sensor bridge circuit. The first and the fourth magnetoresistive vortex sensor element have a first resistance transfer function with a first saturation range. The second and the third magnetoresistive vortex sensor element have a second resistance transfer function with a second, different saturation range. Furthermore, the magnetic sensor bridge circuit comprises a monitoring circuit configured to monitor a voltage between a common terminal of the first and the second magnetoresistive vortex sensor element and a common terminal of the third and the fourth magnetoresistive vortex sensor element. The monitoring circuit is configured to generate an output signal in case the voltage varies by more than a predefined threshold.

According to a third aspect of the present disclosure it is provided a sensor system. The sensor system comprises a first magnetic sensor bridge circuit. The first magnetic sensor bridge circuit comprises a first magnetoresistive vortex sensor element and a second magnetoresistive vortex sensor element. The first and the second magnetoresistive vortex sensor element are connected in series. Furthermore, the first magnetic sensor bridge circuit comprises a third magnetoresistive vortex sensor element and a fourth magnetoresistive vortex sensor element. The third and the fourth magnetoresistive vortex sensor element are connected in series. The first and the third magnetoresistive vortex sensor element are connected to a first supply terminal of the sensor system. The second and the fourth magnetoresistive vortex sensor element are connected to a second, different supply terminal of the sensor system. The first and the fourth magnetoresistive vortex sensor element have a first resistance transfer function with a first saturation range. Moreover, the sensor system comprises a second magnetic sensor bridge circuit located in proximity to the first magnetic sensor bridge circuit. The second magnetic sensor bridge circuit comprises a fifth magnetoresistive vortex sensor element and a sixth magnetoresistive vortex sensor element. The fifth and the sixth magnetoresistive vortex sensor element are connected in series. Furthermore, the second magnetic sensor bridge circuit comprises a seventh magnetoresistive vortex sensor element and an eighth magnetoresistive vortex sensor element. The seventh and the eighth magnetoresistive vortex sensor element are connected in series. The fifth and the seventh magnetoresistive vortex sensor element are connected to a third supply terminal of the sensor system. The sixth and the eighth magnetoresistive vortex sensor element are connected to a fourth, different supply terminal of the sensor system. The fifth and the eighth magnetoresistive vortex sensor element have a second resistance transfer function with a second, different saturation range. Moreover, the sensor system comprises a monitoring circuit configured to monitor a voltage between a first test terminal and a second test terminal of the sensor system and to generate an output signal in case the voltage varies by more than a predefined threshold.

According to a fourth aspect of the present disclosure it is provided a method for forming a sensor circuit. The method comprises forming a first magnetoresistor having a first resistance transfer function. Furthermore, the method comprises forming a second magnetoresistor having a second different resistance transfer function. Furthermore, the method comprises connecting the first and the second magnetoresistor in series between a first and a second supply terminal of the sensor circuit.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or," this is to be understood to disclose all possible combinations (i.e., only A, only B, as well as A and B). An alternative wording for the same combinations is "at least one of A and B". The same applies for combinations of more than 2 elements.

The terminology used herein for the purpose of describing particular examples is not intended to be limiting for further examples. Whenever a singular form such as "a," "an," and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes," and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
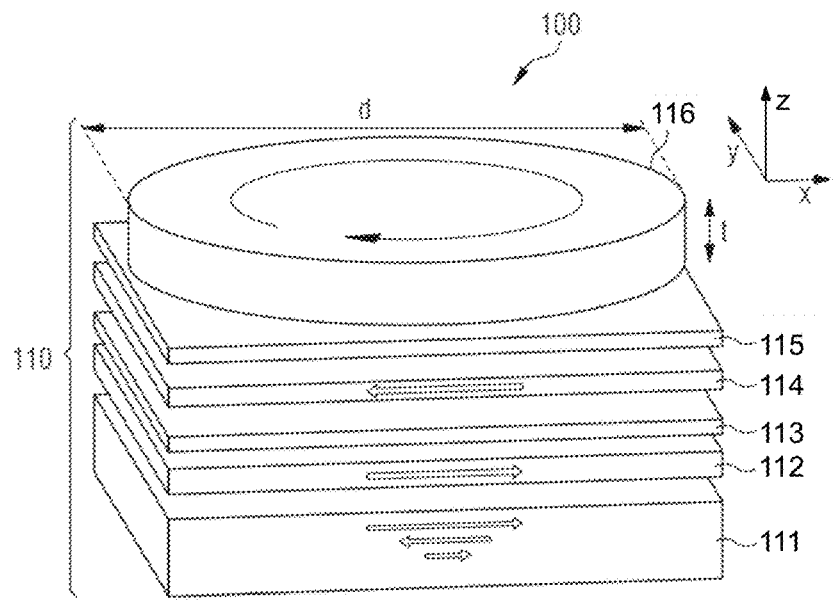
FIG. 1 shows an exploded view example of a Tunnel MagnetoResistive (TMR) Bottom Spin Valve (BSV) structure with a free layer in magnetic vortex state.

FIG. 1 shows an example of a tunnel-magneto-resistive (TMR) magnetoresistor 100, which is also known as a spin valve or Bottom Spin Valve (BSV). The TMR magnetoresistor 100 has a layer stack 110 of alternating ferromagnetic and non-ferromagnetic layers arranged on a common substrate (not shown). If described in a Cartesian coordinate system with pair-wise perpendicular coordinate axes x, y, and z, the layers each extend laterally in a plane spanned by the x and y axes. The (vertical) extent of a layer in z-direction may be described as the layer thickness t.

From the bottom up, TMR magnetoresistor 100 comprises an antiferromagnetic pinning layer 111 and a ferromagnetic pinned layer 112. Contact between pinning layer 111 and pinned layer 112 provokes an effect known as exchange bias effect, causing the magnetization of pinned layer 112 to align in a preferred direction. Pinned layer 112 exhibits a linear magnetic flux pattern which, in the example of FIG. 1, is parallel to the x-direction. TMR magnetoresistor 100 further comprises a coupling layer 113. Coupling layer 113 may be diamagnetic and, for example, comprise ruthenium, iridium, copper and/or copper alloys and similar materials. Coupling layer 113 spatially separates pinned layer 112 from a magnetic (e.g., ferromagnetic) reference layer 114. Using this setup, magnetization of reference layer 114 may align and be held in a direction anti-parallel (e.g., in negative x-direction) to the magnetization of pinned layer 112. In this way, reference layer 114 can have a straight reference magnetization. Magnetic field lines running through reference layer 114 may be parallel to each other and directed in negative x-direction. The straight reference magnetization of reference layer 114 may be permanent. TMR magnetoresistor 100 also comprises a tunnel barrier 115 which is electrically insulating and separates magnetic reference layer 114 from a magnetic (e.g., ferromagnetic) free layer 116.

Free layer 116, reference layer 114, and pinned layer 112 may in some embodiments comprise iron, cobalt, or nickel, and in some further embodiments alloys of these. Alloys may also comprise non-ferromagnetic materials (e.g., carbon, boron, nitrogen and oxygen) with ferromagnetic materials constituting at least 50% of a material composition of the respective layer. For example, layers may comprise cobalt-iron (CoFe), CoFeB, or nickel-iron (NiFe), alloys. In contrast, pinning layer 111 may comprise for example iridium, manganese, platinum, and/or alloys comprising these.

In FIG. 1 free layer 116 is of circular shape, or, in other words, has a disk-like structure. The disk has a diameter d which may, for example be in a range of several hundred nm to 10 μm. The disk further has a thickness t in the range of, for example, 10 nm to 300 nm. The thickness may exceed a thickness of the reference layer 114 by at least a factor of 3. Providing a layer having a rotationally symmetric structure may lead to spontaneous formation of a closed flux magnetization pattern (e.g., a vortex magnetization pattern) in free layer 116. That is to say, the free layer 116 may be configured to spontaneously generate a vortex magnetization pattern inside itself. Depending on the exact shape of free layer 116, the closed flux magnetization pattern may, for instance, comprise at least partially a Landau pattern, a circumferential pattern, a vortex pattern or a combination of any of the previously-mentioned patterns. A Landau pattern comprises at least partially a polygon-like closed shape, while a circumferential pattern may comprise a smoother, rounder closed shape. A (pure) vortex magnetization pattern may be essentially circular.

An in-plane closed flux magnetization pattern may comprise any combination of the previously-mentioned patterns. Moreover, a closed magnetization line of a magnetization pattern may be fully shaped according to any of the previously-mentioned patterns, but may also comprise sections following a different closed flux magnetization pattern. The different types of closed flux magnetization pattern may also be commonly referred to as vortex or vortex magnetization pattern. The vortex state (e.g., the state when a vortex magnetization pattern is present in the free layer 116) may be obtained by choosing the disk thickness t in the range of, for example, 30 nm to 300 nm and the disk diameter d between, for example, 500 nm and 10 µm. In a vanishing (externally imposed) magnetic field, a center of the vortex may be essentially located at a center of the free layer 116 such that a net magnetization of the free layer 116 essentially vanishes.

In some examples, the magnetic free layer of an xMR structure (e.g., the TMR magnetoresistor 100) is of centrally symmetric shape. This shape may in other words result from rotation by a predetermined angle around a central axis parallel to the z-direction, and for example comprise equiangular, equilateral, or regular polygons (e.g., triangle, square, hexagon, etc.), or ellipses. Spontaneous vortex formation may thus be facilitated.

Examples of sensor circuits, magnetic sensor bridge circuits, and/or sensor systems of the present disclosure may comprise the magnetoresistor 100 of FIG. 1 and/or similar magnetoresistors (e.g., vortex spin valve structures). Vortex spin valve structures are not limited to the TMR effect. Other examples of the present disclosure can comprise Giant Magneto-Resistive (GMR) structures and/or structures based on other xMR effects. The magnetoresistor 100 may correspond to a magnetoresistive vortex sensor element as employed by at least some embodiments of this disclosure.

While in operation, or when coupled to an electric circuit, electrical charges may pass from one side of tunnel barrier 115 to the other in a predetermined amount if a constant externally imposed magnetic field is applied. The TMR effect is a quantum physical phenomenon expressing itself in a change of the amount of charges passing the tunnel barrier 115 when the strength and/or the direction of the externally imposed magnetic field is changed. This effect may arise due to directional changes of the magnetization of free layer 116 caused by the changing external magnetic field. In this way, an electrical resistance between a first and a second terminal (not shown in FIG. 1) of the TMR magnetoresistor 100 may depend on the externally imposed magnetic field (e.g., on its strength and/or direction). For example, the first terminal may comprise a first electrode contacting the free layer 116, and the second terminal may comprise a second electrode contacting the reference layer 114. The electrical resistance between the first and the second terminal may then be referred to as the resistance of the TMR magnetoresistor 100. Additionally, a resistor of fixed resistance (that does not change with an externally imposed magnetic field) can be coupled between the first and the second terminal of the TMR magnetoresistor 100. This can shift the resistance of the magnetoresistor 100 by a fixed offset to higher values.

The dependence of the resistance of a magnetoresistor (e.g., the TMR magnetoresistor 100) on an externally imposed magnetic field H can be described by a resistance transfer function of the magnetoresistor. Critical parameters which may describe the regime in which the vortex state exists are nucleation field $H_n$, where the vortex nucleates (e.g., is generated in the free layer 116), and annihilation field $H_{an}$, where it gets destroyed (e.g., is removed in the free layer 116).

Figure 2:
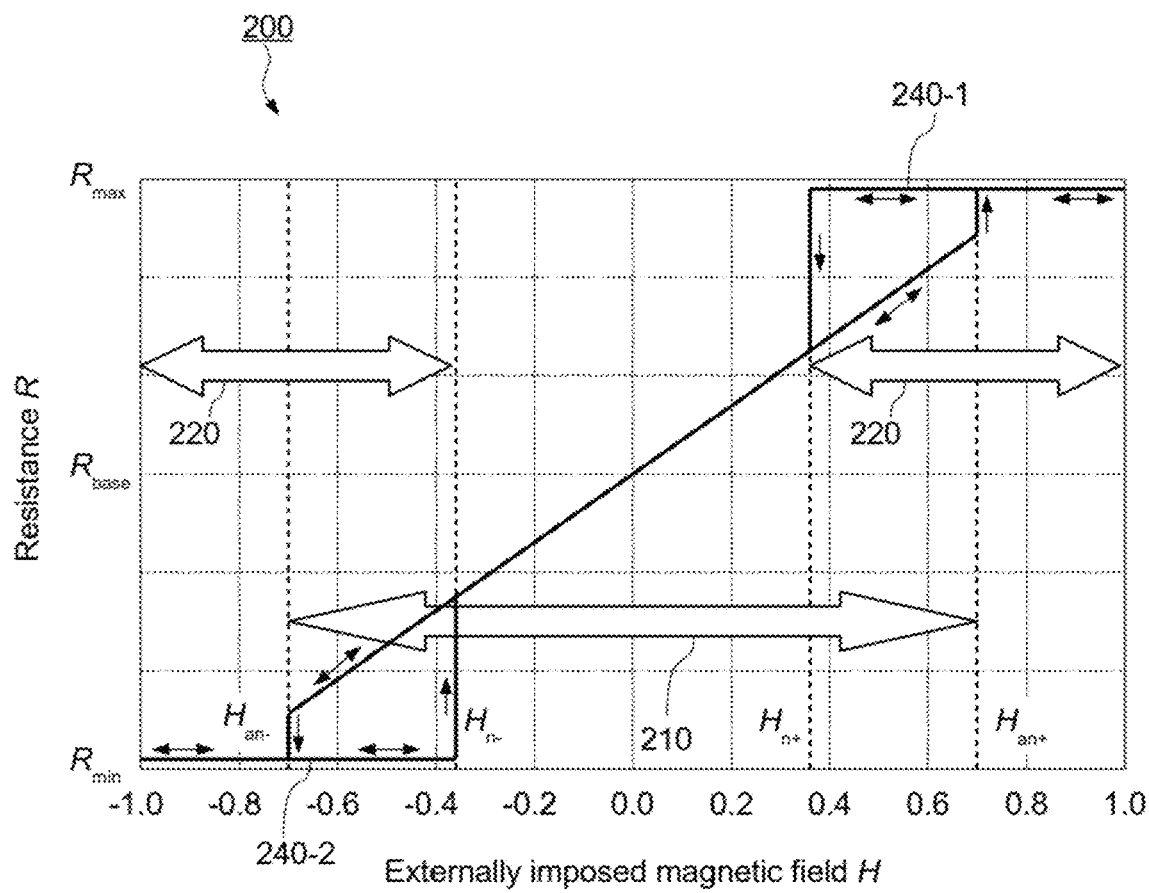
FIG. 2 shows a schematic resistance transfer function of a magnetoresistor.

FIG. 2 depicts a schematic resistance transfer function 200 of a magnetoresistor showing the vortex characteristics nucleation field $H_n$ and annihilation field $H_{an}$. Plotted is the electrical resistance R of the magnetoresistor against an externally imposed magnetic field H. A positive magnetic field H causing an increase in resistance represents a magnetic field in opposite direction to a reference magnetization of a magnetic reference layer of the magnetoresistor. A negative magnetic field H causing a decrease in resistance represents a magnetic field in direction of the reference magnetization. Two different ranges of the resistance transfer function 200 can be distinguished, a linear range 210 and a saturation range 220.

If the magnetic field H amounts to a value between the nucleation fields $H_{n+}$ and $H_{n-}$, vortex nucleation may always be ensured and a vortex magnetization pattern can be generated in a magnetic free layer of the magnetoresistor. If a vortex magnetization pattern is present and the externally imposed magnetic field H is kept below the annihilation fields $H_{an+}$ and $H_{an-}$, the vortex magnetization pattern can remain. In the presence of the vortex magnetization pattern, the magnetoresistor can operate in the linear range 210. Therein, the resistance change of the magnetoresistor may depend (substantially) linearly on the strength of the magnetic field H. At vanishing externally imposed magnetic field H, the resistance of the magnetoresistor is denoted as the base resistance of the magnetoresistor (or of the resistance transfer function). Within the linear range 210, an (absolute) sensitivity of the magnetoresistor (or of the resistance transfer function 200) can be defined as the (absolute) variation in resistance relative to the base resistance for a given variation of the magnetic field H. Absolute sensitivity can be expressed in Ohm per milli-Tesla (Ω/mT) or in Ohm times Meter per Ampere (Ωm/A). Furthermore, within the linear range 210, a relative sensitivity of the magnetoresistor (or of the resistance transfer function 200) can be defined as the variation in resistance relative to the base resistance for a given variation of the magnetic field H. Relative sensitivity can be expressed in percent per milli-Tesla (%/mT) or in percent times Meter per Ampere (% m/A). If not otherwise explicitly stated herein, the term sensitivity shall refer to the absolute sensitivity.

If the magnetic field H reaches and/or exceeds the annihilation fields $H_{an+}$ or $H_{an-}$, the vortex can be destroyed (e.g., removed in the free layer). The magnetoresistor then operates in the saturation range 220, where the resistance can remain (substantially) constant with respect to the magnetic field H and can be approximately maximal at $R_{max}$ or minimal at $R_{min}$ depending on the direction of the magnetic field H. Reducing the magnetic field H below the annihilation fields $H_{an+}$ and $H_{an-}$ cannot immediately bring back the vortex magnetization pattern in the free layer. To generate again a vortex magnetization pattern, the strength of the magnetic field H may be reduced below the nucleation field $H_{n+}$ and $H_{n-}$ (e.g., for a negative field H the absolute value of H may be reduced below the absolute value of $H_{n-}$ to regenerate the vortex magnetization pattern). In consequence, the resistance of the magnetoresistor may follow a hysteresis curve 240-1, 240-2. As shown in FIG. 2, within the hysteresis 240-1, 240-2 abrupt changes (e.g., jumps) in resistance may occur at the annihilation fields $H_{an+}$ and $H_{an-}$ as well as at the nucleation fields $H_{n+}$ and $H_{n-}$.

In an application of a magnetoresistor (e.g., inside a sensor for measuring magnetic field strengths), the magnetoresistor (or magnetoresistors) of the sensor may be driven into the saturation range 220. This may be undesirable, because in the saturation range 220, the resistance may remain constant and hence changes of an externally imposing magnetic field might not be detected anymore by the sensor. Due to saturation, the strength of the magnetic field may appear lower than its actual value. On the other hand, if the strength of the magnetic field drops again below the annihilation fields $H_{an+}$ and $H_{an-}$ the magnetoresistor (or magnetoresistors) of the sensor may still be in the saturation range 220 as long as the magnetic field does not drop below the nucleation fields $H_{n+}$ or $H_{n-}$, respectively. The strength of the magnetic field may then be misinterpreted as being too high. In consequence, the sensor may operate unreliably, because its output signal might not correctly represent the actual externally imposing magnetic field. A task of at least some examples of the present disclosure may hence be to provide another kind of sensor circuit for detecting whether or not a sensor for measuring magnetic fields is operating in the linear range or is in the saturation range.

Figure 3:
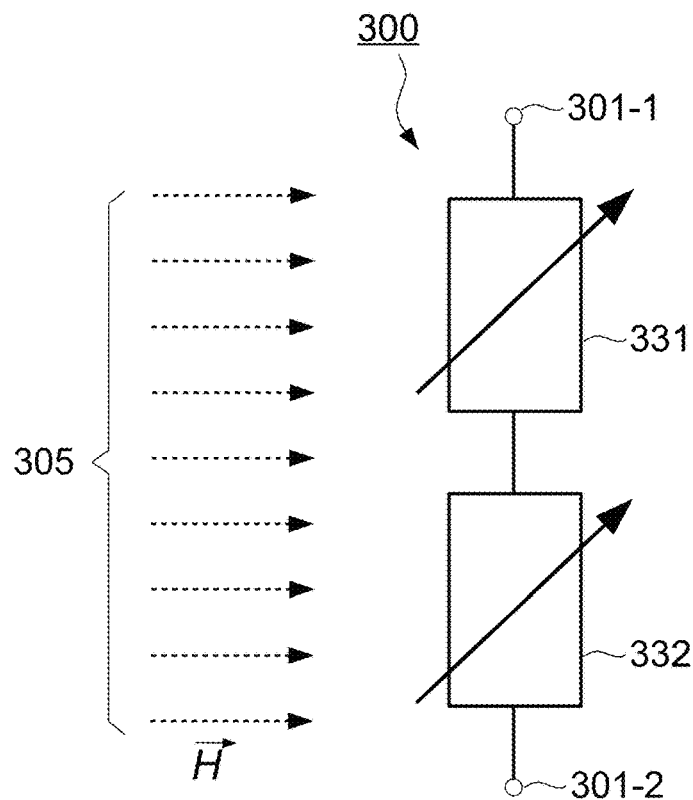
FIG. 3 shows a schematic diagram of a sensor circuit.

According to a first aspect of the present disclosure, FIG. 3 shows a schematic diagram of a sensor circuit 300. The sensor circuit 300 comprises a first magnetoresistor 331. The first magnetoresistor 331 has a first resistance transfer function. Furthermore, the sensor circuit 300 comprises a second magnetoresistor 332. The second magnetoresistor 332 has a second resistance transfer function. The second resistance transfer function is different from the first resistance transfer function. The first magnetoresistor 331 and the second magnetoresistor 332 are connected in series between a first supply terminal 301-1 of the sensor circuit 300 and a second supply terminal 301-2 of the sensor circuit 300.

By arranging the first and the second magnetoresistors 331, 332 of different resistance transfer function within the series connection located between the first and the second supply terminal 301-1, 301-2 of the sensor circuit 300, a voltage across the first and/or second magnetoresistor 331, 332 may vary in response to an external magnetic field 305 imposing on the first and the second magnetoresistors 331, 332 during operating the sensor circuit 300. The voltage across the first and/or second magnetoresistor 331, 332 may then be indicative for the strength and/or the direction of the magnetic field 305.

To this end, the first supply terminal 301-1 may be connected to a first supply voltage of the sensor circuit 300 (e.g., a positive supply voltage such as +3.3 V, +5 V or +10 V), and the second supply terminal 301-2 may be connected to a second supply voltage sensor circuit 300 (e.g., a negative supply voltage, such as −3.3 V, −5 V or −10 V, or to ground).

The sensor circuit 300 may additionally comprise a monitoring circuit. The monitoring circuit can be configured to monitor a voltage between a node between the first and the second magnetoresistor 331, 332 and a reference node. Moreover, the monitoring circuit can be configured to generate an output signal in case the voltage varies by more than a predefined threshold.

For example, a first terminal of the first magnetoresistor 331 can be connected to the first supply terminal 301-1. A second terminal of the first magnetoresistor 331 can be connected to a first terminal of the second magnetoresistor 332. A second terminal of the second magnetoresistor 332 can be connected to the second supply terminal 301-2. The node between the first and the second magnetoresistor 331, 332, where the voltage can be monitored, can then correspond to (e.g., be) the second terminal of the first magnetoresistor 331 and/or the first terminal of the second magnetoresistor 332. The reference node can be at ground potential, for example.

In response to the externally imposed magnetic field 305, the resistance of the first magnetoresistor 331 and the second magnetoresistor 332 can be detuned from their respective base resistances. This can detune a voltage divider established by the first magnetoresistor 331 and the second magnetoresistor 332. The monitored voltage between the node between the first magnetoresistor 331 and the second magnetoresistor 332 and the reference node can hence change. For example, a stronger externally imposed magnetic field 305 can cause a stronger variation of the monitored voltage compared, for example, to a voltage at vanishing external magnetic field can be. When the monitored voltage deviates more than the predefined threshold from the voltage at vanishing external magnetic field, the monitoring circuit may generate the output signal to indicate that the external magnetic field has increased above a certain strength. The predefined threshold may, for example, be set to a value larger than 10 mV (or larger than 100 mV, or larger than 1 V) and smaller than 5 V (or smaller than 2 V, or smaller than 200 mV, or smaller than 20 mV) above and/or below the voltage at vanishing external magnetic field.

The first resistance transfer function of the first magnetoresistor 331 and the second resistance transfer function of the second magnetoresistor 332 can comprise each a respective linear range and a respective saturation range (e.g., the first resistance transfer function can comprise a first linear and a first saturation range, and the second resistance transfer function can comprise a second linear and a second saturation range). Respective transitions from the linear to the saturation range of the first and the second resistance transfer function can occur at different transition field strengths (e.g., at different absolute values) of the externally imposed magnetic field 305. In this manner, the second resistance transfer function can be different from the first resistance transfer function. Moreover, on incidence of the external magnetic field on the first magnetoresistor 331 and the second magnetoresistor 332 the resistance of both the first magnetoresistor 331 and the second magnetoresistor 332 may increase or decrease, depending on the direction of the magnetic field.

A (second) transition field strength from the second linear range to the second saturation range of the second resistance transfer function can be at least 1.1 times (or at least 1.5 times, or at least twice, or at least five times) as high as a (first) transition field strength from the first linear range to the first saturation range of the first resistance transfer function. In this way, the first and the second magnetoresistors may go into the saturation range at different strengths (e.g., at different absolute values) of the externally imposed magnetic field 305. This may cause a change in the monitored voltage, which can be used for detecting saturation of one and/or both of the first magnetoresistor 331 and the second magnetoresistor 332.

For a given variation of the externally imposed magnetic field 305, a resistance variation of the first magnetoresistor 331 relative to a base resistance of the first magnetoresistor 331 can correspond (e.g., be substantially equal) to a resistance variation of the second magnetoresistor 332 relative to a base resistance of the second magnetoresistor 332. The respective base resistance denotes a resistance at vanishing externally imposed magnetic field. In this way, the resistance of the first magnetoresistor 331 and the second magnetoresistor 332 can change (e.g., both increase or both decrease)

by the same factor in response to the externally imposed magnetic field 305 as long as the first magnetoresistor 331 and the second magnetoresistor 332 are in their respective linear range. The monitored voltage can thus remain constant (e.g., neglecting noise influences and manufacturing tolerances). Once the first magnetoresistor 331 or the second magnetoresistor 332 reaches the saturation range, the voltage divider established by the first magnetoresistor 331 and the second magnetoresistor 332 can start detuning causing a variation in the monitored voltage. Hence, a constant monitored voltage can be indicative for the first magnetoresistor 331 and the second magnetoresistor 332 being in the linear range, whereas a variation in the monitored voltage can be indicative for (at least) one of the first magnetoresistor 331 and the second magnetoresistor 332 having entered the saturation range.

The first magnetoresistor 331 and the second magnetoresistor 332 can each comprise a respective magnetic free layer configured to spontaneously generate a vortex magnetization pattern in the magnetic free layer. Furthermore, the first magnetoresistor 331 and the second magnetoresistor 332 can each comprise a respective magnetic reference layer having a straight reference magnetization pattern. For example, the first magnetoresistor 331 and the second magnetoresistor 332 can correspond to the TMR magnetoresistor 100 of FIG. 1.

Respective magnetization patterns of the respective magnetic reference layers of the first magnetoresistor 331 and the second magnetoresistor 332 can be oriented in such a manner that the respective resistances of both the first magnetoresistor 331 and the second magnetoresistor 332 may either commonly increase or commonly decrease in response to the external magnetic field 305. For example, the external magnetic field may have the same direction at the first magnetoresistor 331 and the second magnetoresistor 332, so that the reference magnetization patterns of the first magnetoresistor 331 and the second magnetoresistor 332 may be parallel (e.g., have the same polarity). Alternatively, when the first magnetoresistor 331 and the second magnetoresistor 332 are arranged in such a manner that the external magnetic field can have an opposite direction at the first magnetoresistor 331 and the second magnetoresistor 332, the reference magnetization patterns may be antiparallel (e.g., have opposite polarity). For example, the first magnetoresistor 331 and the second magnetoresistor 332 with antiparallel reference magnetization patterns may be arranged on opposite sides of a current carrying conductor that causes a magnetic field of opposite directions at the first magnetoresistor 331 and the second magnetoresistor 332.

Furthermore, a dimension of the magnetic free layer of the first magnetoresistor 331 can be different to a corresponding dimension of the magnetic free layer of the second magnetoresistor 332. This can result in the first resistance transfer function being different from the second resistance transfer function, for example, in terms of annihilation field strength, base resistance, and/or sensitivity. For example, a dimension (e.g., a thickness, a diameter, and/or a lateral area) of the magnetic free layer of the first magnetoresistor 331 can differ from the corresponding dimension of the magnetic free layer of the second magnetoresistor 332 by at least a factor of 1.1 (or at least a factor of 1.5, or at least a factor of 2, or at least a factor of 5) and/or at most by a factor of 20 (or at most by a factor of 10).

The first magnetoresistor 331 and the second magnetoresistor 332 can be integrated into an integrated circuit. A thickness of the magnetic free layer of the first magnetoresistor 331 can be equal (e.g., neglecting manufacturing tolerances) to a thickness of the magnetic free layer of the second magnetoresistor 332, whereas a lateral area of the magnetic free layer of the first magnetoresistor 331 can differ from a lateral area of the magnetic free layer of the second magnetoresistor 332. For example, a diameter of the magnetic free layer of the first magnetoresistor 331 can be larger than a diameter of the magnetic free layer of the second magnetoresistor 332 by at least a factor of 1.1 (or at least a factor of 1.5, or at least a factor of 2, or at least a factor of 5) and/or at most by a factor of 20 (or at most by a factor of 10). By providing the same thickness to the magnetic free layers of the first magnetoresistor 331 and the second magnetoresistor 332, the first magnetoresistor 331 and the second magnetoresistor 332 may be formed during the same manufacturing step during production of the integrated circuit. Different lateral areas of the magnetic free layers may, for example, be obtained by an etching step incorporating different openings of a photolithographic mask for the first magnetoresistor 331 and the second magnetoresistor 332.

Figure 4:
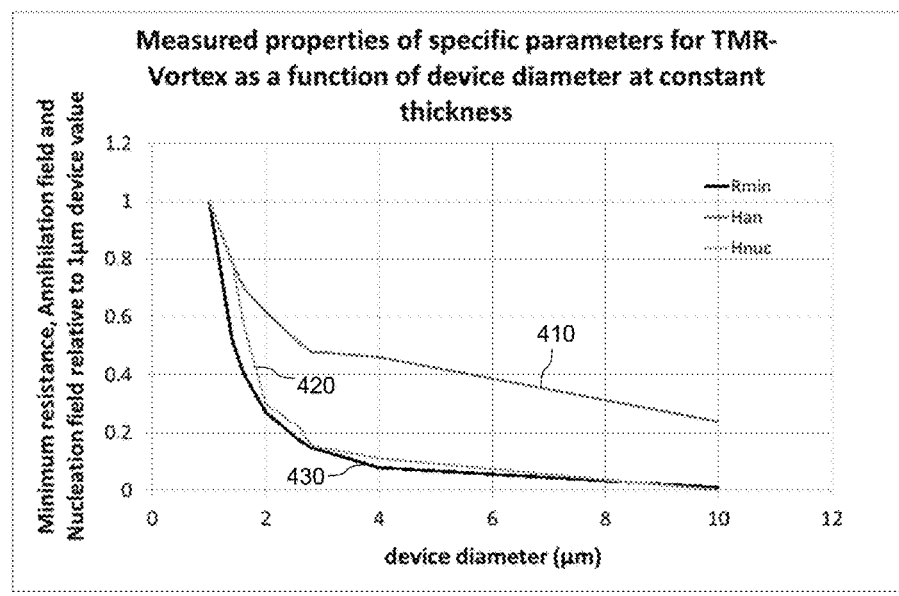
FIG. 4 shows plots of an annihilation field strength, a nucleation field strength, and a minimum resistance of a TMR magnetoresistor depending on a device diameter.

Furthermore, different lateral areas (e.g., different diameters) of the magnetic free layers of the first magnetoresistor 331 and the second magnetoresistor 332 can be used to design different annihilation field strengths, different nucleation field strength, and/or different minimum resistances of the first magnetoresistor 331 and the second magnetoresistor 332. This is depicted in FIG. 4. Curve 410 displays the annihilation field strength, curve 420 the nucleation field strength, and curve 430 the minimum resistance of a TMR magnetoresistor depending on a device diameter (e.g., the diameter of the magnetic free layer and/or of all ferromagnetic and non-ferromagnetic layers of a layer stack of the magnetoresistor) for constant thickness (e.g., of the magnetic free layer and/or of all ferromagnetic and non-ferromagnetic layers). The annihilation field strength, the nucleation field strength, and the minimum resistance decrease with increasing device diameter.

According to some examples, an annihilation field strength for removing the vortex magnetization pattern in the magnetic free layer of the first magnetoresistor 331 is different from an annihilation field strength for removing the vortex magnetization pattern in the magnetic free layer of the second magnetoresistor 332. For example, the annihilation field strength of the second resistance transfer function is at least 1.1 times (or at least 1.5 times, or at least twice, or at least five times) as large as the annihilation field strength of the first resistance transfer function. A larger difference between the annihilation field strengths may facilitate that only one the magnetoresistors (e.g., the first magnetoresistor 331) can enter the saturation range while the other (e.g., the second magnetoresistor 332) can remain in the linear range. This can cause a higher and thus more easily detectable variation in the monitored voltage. In turn, the sensor circuit 300 may operate more reliably.

Furthermore, a nucleation field strength for generating the vortex magnetization pattern in the free layer of the first magnetoresistor 331 can be different from a nucleation field strength for generating the vortex magnetization pattern in the free layer of the second magnetoresistor 332. For example, the nucleation field strength of the second resistance transfer function is at least 1.1 times (or at least 1.5 times, or at least twice, or at least five times) as large as the nucleation field strength of the first resistance transfer function.

According to some embodiments, the nucleation field strength of the second resistance transfer function is larger than the annihilation field strength of the first resistance transfer function. Alternatively, the nucleation field strength of the second resistance transfer function may be lower than the annihilation field strength of the first resistance transfer function.

In some embodiments, the sensor circuit 300 is a bridge circuit. A first branch of the bridge circuit can comprise the first and the second magnetoresistor 331, 332. For example, the sensor circuit 300 can be a Wheatstone bridge, a Thomson bridge, a Wien bridge, a Wien-Robinson bridge, a Schering bridge or a combination of the mentioned bridge circuits. By implementing the sensor circuit 300 as a bridge circuit, accuracy of the detection of the externally imposed magnetic field 305 may be increased.

For example, the bridge circuit can be a half bridge with the first magnetoresistor 331 and the second magnetoresistor 332 being variable and two resistors of a second branch of the bridge circuit being fixed (e.g., independent of the externally imposed magnetic field). Alternatively, the bridge circuit can be a three-quarter bridge with the first magnetoresistor 331 and the second magnetoresistor 332 being variable and one resistor of the second branch of the bridge circuit being also a magnetoresistor, whereas the other resistor of the second branch may be fixed.

According to at least some embodiments, the sensor circuit 300 can be a full bridge circuit. The sensor circuit 300 can then comprise a second branch. The second branch can comprise a third magnetoresistor having a third resistance transfer function and a fourth magnetoresistor having a fourth resistance transfer function. The fourth resistance transfer function can be different from the third resistance transfer function. The third and the fourth magnetoresistor can be connected in series between the first and the second supply terminal of the sensor circuit 300. In other words, the series connection of the third and the fourth magnetoresistor can be connected in parallel to the series connection of the first magnetoresistor 331 and the second magnetoresistor 332. With a full bridge circuit, accuracy of the detection of the externally imposed magnetic field 305 may be further increased.

Additionally, the third resistance transfer function can correspond (e.g., be substantially equal) to the second resistance transfer function, and the fourth resistance transfer function can correspond (e.g., be substantially equal) to the first resistance transfer function.

In an exemplary implementation, a first terminal of the first magnetoresistor 331 is connected to the first supply terminal 301-1. Moreover, a second terminal of the first magnetoresistor 331 is connected to a first terminal of the second magnetoresistor 332. Moreover, a second terminal of the second magnetoresistor 332 is connected to the second supply terminal 301-2. Moreover, a first terminal of the third magnetoresistor is connected to the first supply terminal 301-1. Furthermore, a second terminal of the third magnetoresistor is connected to a first terminal of the fourth magnetoresistor. Furthermore, a second terminal of the forth magnetoresistor is connected to the second supply terminal 301-2.

With such a configuration of the magnetoresistors of a full bridge circuit and with the third resistance transfer function corresponding to the second resistance transfer function and the fourth resistance transfer function corresponding to the first resistance transfer function, a voltage between the second terminal of the first magnetoresistor and the second terminal of the third magnetoresistor can be constant (e.g., neglecting noise and influences of manufacturing tolerances of the magnetoresistors) as long as the first, second, third, and fourth magnetoresistor are in the linear range. Once either the first and the fourth magnetoresistor or the second and the third magnetoresistor enter the saturation range, the full bridge circuit can be detuned and the voltage can deviate from its constant value that is present when the magnetoresistors are all in the linear range. This deviation of the voltage can be indicative for the strength of the externally imposed magnetic field 305. For example, the (monitored) voltage showing deviation can reveal that the externally imposed magnetic field 305 has risen above a certain level (e.g., above the annihilation field strength of the first and/or the second resistance transfer function).

To this end, a monitoring circuit of the sensor circuit 300 can be configured to monitor the voltage between the second terminal of the first magnetoresistor (or the first terminal of the second magnetoresistor) and the second terminal of the third magnetoresistor (or the first terminal of the fourth magnetoresistor) and to generate an output signal in case the (monitored) voltage varies by more than a predefined threshold. In other words, the monitoring circuit can be configured to monitor the bridge voltage between the first and the second branch of the sensor circuit 300.

Figure 5:
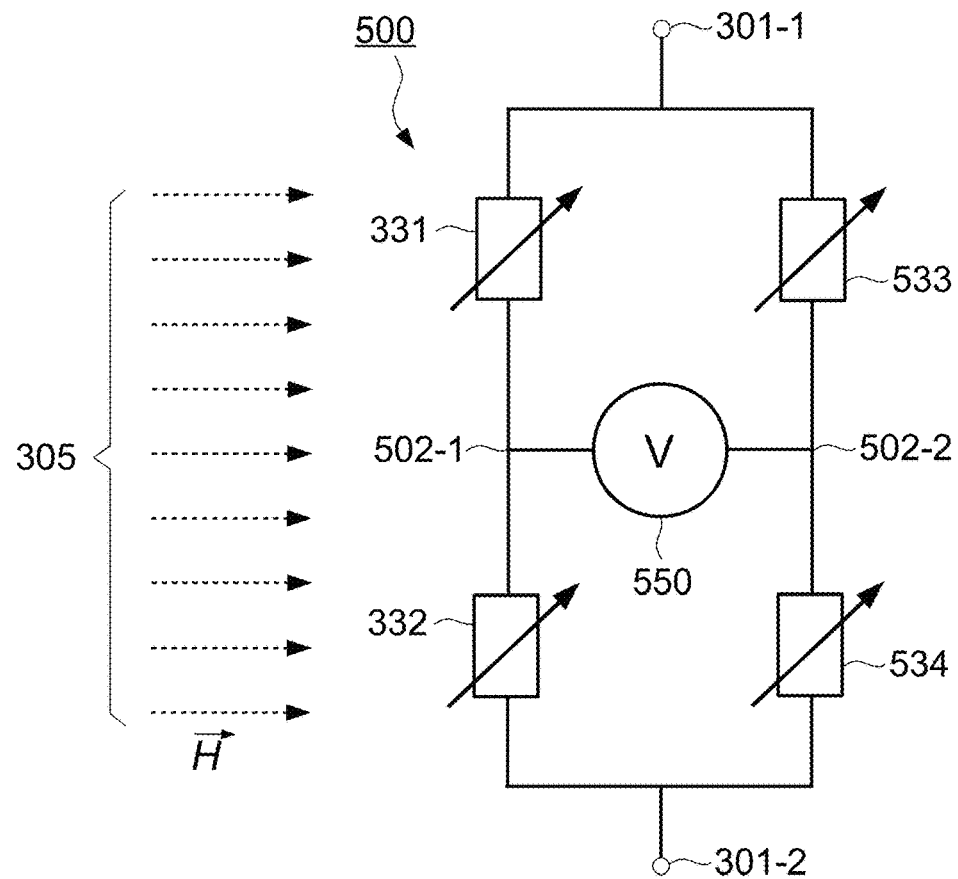
FIG. 5 shows a schematic diagram of a magnetic sensor bridge circuit.

The detection and/or measurements of magnetic fields according to at least some embodiments of the present disclosure are explained in more detail with reference to FIG. 5. FIG. 5 shows a schematic diagram of a magnetic sensor bridge circuit 500. The magnetic sensor bridge circuit 500 comprises a first magnetoresistive vortex sensor element 331 and a second magnetoresistive vortex sensor element 332. The first and the second magnetoresistive vortex sensor element 331, 332 are connected in series. Furthermore, the magnetic sensor bridge circuit 500 comprises a third magnetoresistive vortex sensor element 533 and a fourth magnetoresistive vortex sensor element 534. The third and the fourth magnetoresistive vortex sensor element 533, 534 are connected in series. The first and the third magnetoresistive vortex sensor element 331, 533 are connected to a first supply terminal 301-1 (e.g., a DC supply voltage) of the magnetic sensor bridge circuit 500. The second and the fourth magnetoresistive vortex sensor element 332, 534 are connected to a second, different supply terminal 301-2 (e.g., ground) of the magnetic sensor bridge circuit 500. The first and the fourth magnetoresistive vortex sensor element 331, 534 have a first resistance transfer function with a first saturation range. The second and the third magnetoresistive vortex sensor element 332, 533 have a second resistance transfer function with a second, different saturation range. Furthermore, the magnetic sensor bridge circuit 500 comprises a monitoring circuit 550 configured to monitor a voltage between a common terminal 502-1 of the first and the second magnetoresistive vortex sensor element 331, 332 and a common terminal 502-2 of the third and the fourth magnetoresistive vortex sensor element 533, 534. Additionally, the monitoring circuit 550 is configured to generate an output signal in case the (monitored) voltage varies by more than a predefined threshold.

A variation in the monitored voltage between the common terminals 502-1, 502-1 may be caused by an externally imposed magnetic field 305 that can vary the resistances of the magnetoresistive vortex sensor elements 331, 332, 533, 534 and may additionally drive at least some of the vortex sensor elements 331, 332, 533, 534 into their saturation range. Similarly to the illustrations above, as long as the first, second, third, and fourth magnetoresistive vortex sensor element 331, 332, 533, 534 are in the linear range, the monitored voltage may remain constant. When the first and the fourth, or the second and the third magnetoresistive vortex sensor element are driven into their respective saturation range by the externally imposed magnetic field 305 rising above the annihilation field strength of the first resistance transfer function or the second resistance transfer function, respectively, the monitored voltage may deviate from its constant value. This effect can be employed for measuring strength (and/or direction) of the magnetic field 305 or for detecting that at least some of the vortex sensor elements 331, 332, 533, 534 have gone into their respective saturation range.

For example, the monitored voltage can be constant as long as the externally imposed magnetic field 305 does not exceed a certain strength (e.g., remains below the annihilation field strengths of the first and the second resistance transfer function). This may be accomplished by design of the first and the second resistance transfer function. Within the linear range, the first and the second resistance transfer function, denoted by $R_1(H)$ and $R_2(H)$, respectively, may be described by the following equations:

$$R_1(H)=R_{1B}+S_1\cdot H;\qquad\text{Equation (1.1):}$$

$$R_2(H)=R_{2B}+S_2 H.\qquad\text{Equation (1.2):}$$

$R_{1B}$ denotes the base resistance (e.g., the resistance at vanishing externally imposed magnetic field) and $S_1$ the (absolute) sensitivity (e.g., in (Ohm times Meter per Ampere) or in (Ohm per Tesla)) of the first resistance transfer function. Concerning the second resistance transfer function, $R_{2B}$ denotes the base resistance and $S_2$ the (absolute) sensitivity (in (Ohm times Meter per Ampere) or in (Ohm per Tesla)). The strength of the externally imposed magnetic field is denoted by H.

With $V_{supply}$ denoting the voltage between the first and the second supply terminal 301-1, 301-2, the voltage $V_M$ between the common terminals 502-1, 502-1 (e.g., the monitored voltage) may be expressed by $$V_M(H) = \frac{R_2(H) - R_1(H)}{R_2(H) + R_1(H)} V_{supply}\qquad\text{Equation (2.1)}$$

The base resistances $R_{1B}$ and $R_{2B}$ as well as the sensitivities $S_1$ and $S_2$ can be adjusted by the design (e.g., the layout) of the first and fourth magnetoresistive vortex sensor element, and the second and third magnetoresistive vortex sensor element, respectively. For example, the base resistance of magnetoresistive vortex sensor elements can be decreased by increasing the lateral area (e.g., the diameter) of both the free layer 116 and the reference layer 114 of a magnetoresistive vortex sensor element as illustrated in FIG. 4. Additionally, the base resistance of magnetoresistive vortex sensor elements may be altered by connecting a resistor that is independent of the externally imposed magnetic field in series (and/or in parallel) to a magnetoresistive vortex sensor element. For example, such resistors can be realized as poly-silicon resistors in an integrated circuit comprising the magnetic sensor bridge circuit 500. Additionally or alternatively, such resistors could also be realized by magnetoresistive elements not sensitive to magnetic fields in the applied direction or by magnetoresistive elements shielded against external fields. The sensitivity of magnetoresistive vortex sensor elements can be increased by decreasing the layer thickness t and/or increasing the diameter d of the free layer 116 (e.g., the disk 116) shown in FIG. 1. The ratio between the thickness and the diameter of the magnetic free layer 116 may, for example, be in a range from 1/500 to 1/5.

A ratio of the base resistance $R_{2B}$ of the second resistance transfer function to the base resistance $R_{1B}$ of the first resistance transfer function can correspond (e.g., be substantially equal) to a ratio of the sensitivity $S_2$ of the second resistance transfer function to the sensitivity $S_1$ of the first resistance transfer function. In other words, the base resistance of the second resistance transfer function may equal the base resistance of the first resistance transfer function multiplied by a constant factor k, and the sensitivity of the second resistance transfer function may equal the sensitivity of the first resistance transfer function multiplied by the same constant factor k. This can be expressed by Equations (2.2) and (2.3):

$$R_{2B}=k\cdot R_{1B};\qquad\text{Equation (2.2):}$$

$$S_2=k\cdot S_1.\qquad\text{Equation (2.3):}$$

Substituting equations (1.1), (1.2), (2.2), and (2.3) into equation (2.1) yields the monitored voltage $V_M$, as long as the first, second, third, and fourth magnetoresistive vortex sensor element are in the linear range:

$$V_M(H) = \frac{k-1}{k+1}V_{supply}.\qquad\text{Equation (2.4)}$$

As can be seen from equation (2.4), the monitored voltage may be independent of the imposed magnetic field 305 as long as the first, second, third, and fourth magnetoresistive vortex sensor element 331, 332, 533, 534 are in the linear range and the conditions described by equations (2.2) and (2.3), for example, are fulfilled.

An annihilation field strength $H_a$ng of the second resistance transfer function can, for example, be at least 1.1 times (or at least 1.5 times, or at least twice, or at least five times) larger than an annihilation field strength $H_{an1}$ of the first resistance transfer function. This can cause the first and the fourth magnetoresistive vortex sensor element 331, 534 to enter the saturation range before the second and the third magnetoresistive vortex sensor element 332, 533 do. Equation (2.4) may then no longer hold. Due to saturation of the first and the fourth magnetoresistive vortex sensor element 331, 534 their respective resistances may remain substantially constant, while the resistances of the second and third magnetoresistive vortex sensor element 332, 533 may further increase or decrease (depending on the direction of the externally imposed magnetic field 305). Hence, the monitored voltage $V_M$ may then depend on the externally imposed magnetic field 305 and start deviating from the constant value given in equation (2.4), for example. This deviation may then be indicative for at least the first and the fourth magnetoresistive vortex sensor element 331, 534 being in the saturation range and that the strength of the magnetic field 305 (e.g., the absolute value of the magnetic field 305) has increased at least above the annihilation field strength $H_{an1}$. The more the strength of the magnetic field 305 may increase, the higher the deviation of the monitored voltage may be.

If the magnetic field 305 is reduced again, the deviation of the monitored voltage may reduce as well. In particular, in course of a reduction the magnetic field 305, the deviation of the monitored voltage may go back to zero, when the magnetic field 305 reaches again the annihilation field strength $H_{an1}$, for example. However further reducing the magnetic field 305 might not result in the deviation of the monitored voltage remaining at zero, but rather changing its sign and showing again deviation. For example, if the monitored voltage had risen to a value above the constant value from Equation (2.4) after having been increased above the annihilation field strength $H_{an1}$, it may decrease below the constant value when being reduced below the annihilation field strength $H_{an1}$ (or vice versa). This can be due to the vortex magnetization pattern not being regenerated in the magnetic free layer of the first and the fourth magnetoresistive vortex sensor element 331, 534 until the externally imposed magnetic field has reached the nucleation field strength $H_{n1}$ of the first resistance transfer function. Due to a discontinuity of the resistance at the nucleation field, the monitored voltage may jump back to its constant value from Equation (2.4) when the magnetic field 305 is reduced below the nucleation field strength $H_{n1}$. In other words, at the nucleation field strength $H_{n1}$ deviation of the monitored voltage may jump back to substantially zero.

The jump (or discontinuity) of the monitored voltage back to its constant value alone or together with the change in sign of the deviation of the monitored voltage can then be indicative for the first and the fourth (and optionally the second and third) magnetoresistive vortex sensor element having entered again their respective linear ranges and/or can be indicative for the external magnetic field 305 having decreased below the nucleation field strength $H_{n1}$. Knowing that the magnetic field 305 has decreased below the nucleation field strength $H_{n1}$ may then assure a user or another circuit component inside a sensor system, that the first, second, third, and fourth magnetoresistive vortex sensor element 331, 332, 533, 534 of the magnetic sensor bridge circuit 500 are again in the linear range and that the magnetic sensor bridge circuit 500 (or another sensor bridge of a sensor system) may hence be used for reliably and correctly determining (e.g., measuring) the magnetic field 305 (e.g., the strength of the magnetic field 305).

To this end, the monitoring circuit 550 can be configured to detect the change in sign of the deviation of the monitored voltage and to detect the jump of the deviation of the monitored voltage back to zero after the change in sign has occurred. For example, the monitoring circuit 550 may comprise a memory subcircuit to store a course of values of the deviation of the monitored voltage. The monitoring circuit 550 may then be configured to detect a change in sign of the deviation of the monitored voltage as a first (necessary) condition and the jump of the deviation of the monitored voltage back to zero as a second (necessary) condition for that the first, second, third, and fourth magnetoresistive vortex sensor element 331, 332, 533, 534 of the magnetic sensor bridge circuit 500 are again in the linear range. The jump of the deviation of the monitored voltage may, for example, be larger than 10 mV (or larger than 100 mV, or larger than 1 V, or larger than 2 V, or larger than 5 V). According to some embodiments, it may be sufficient to detect the jump of the deviation of the monitored voltage back to zero as a single condition for the first, second, third, and fourth magnetoresistive vortex sensor element 331, 332, 533, 534 of the magnetic sensor bridge circuit 500 having returned to their respective linear range.

For example, the magnetic sensor bridge circuit 500 may comprise a first and a second operating mode. In the first operating mode of the magnetic sensor bridge circuit the first and the fourth magnetoresistive vortex sensor element 331, 534 can be operated within the linear range of the first resistance transfer function and the second and the third magnetoresistive vortex sensor element 332, 533 can be operated within the linear range of the second resistance transfer function. In the second operating mode of the magnetic sensor bridge circuit, the first and the fourth magnetoresistive vortex sensor element 331, 534 can be operated within the saturation range of the first resistance transfer function. The second and the third magnetoresistive vortex sensor element 332, 533 may be operated in the linear or the saturation range of the second resistance transfer function during the second operating mode.

In other words, the effect of saturation of the first and the fourth magnetoresistive vortex sensor element 331, 533 may be used to detect that the externally imposed magnetic field has risen above a certain level (e.g., above the annihilation field strength $H_{an1}$ of the first resistance transfer function). In the first operating mode, the monitored voltage may remain constant and might not vary more than a predefined threshold. In the second operating mode, the monitored voltage may vary more or may have varied more than the predefined threshold and might not have undergone a jump larger than a certain amplitude (e.g., at least larger than 10 mV) back to its original constant value of the first operating mode. In some examples, the jump of the monitored voltage may be at least as large as the predefined threshold.

Additionally, the monitoring circuit 550 may generate the output signal during the second operating mode. The output signal of the monitoring circuit 550 can then indicate saturation of (at least) the first and the fourth magnetoresistive vortex sensor element 331, 534.

Turning once more to Equations (2.2), (2.3), and (2.4), the ratio of the base resistance of the second resistance transfer function to the base resistance of the first resistance function (and hence the ratio of the sensitivity of the second resistance transfer function to the sensitivity of the first resistance function) can be larger than larger than 1.1 (or larger than 1.5, or larger than 2, or larger than 5) and/or smaller than 20 (or smaller than 10), according to some embodiments of the present disclosure. As stated by Equation (2.4), the monitored voltage may thus be different from zero when the first, second, third, and fourth magnetoresistive vortex sensor element 331, 332, 533, 534 are in the linear range (e.g., during the first operating mode of the magnetic sensor bridge circuit 500). This can enable the usage of a unipolar digital-to-analog converter (DAC) for sampling the monitored voltage, which may in turn reduce circuit design effort.

Alternatively, the constant factor k of Equations (2.2) to (2.4) can be equal to one, which means that the base resistance of the first and the second resistance transfer function are equal and that the sensitivity of the first and the second resistance transfer function are equal as well. This is now illustrated in more detail in FIG. 6.

Figure 6:
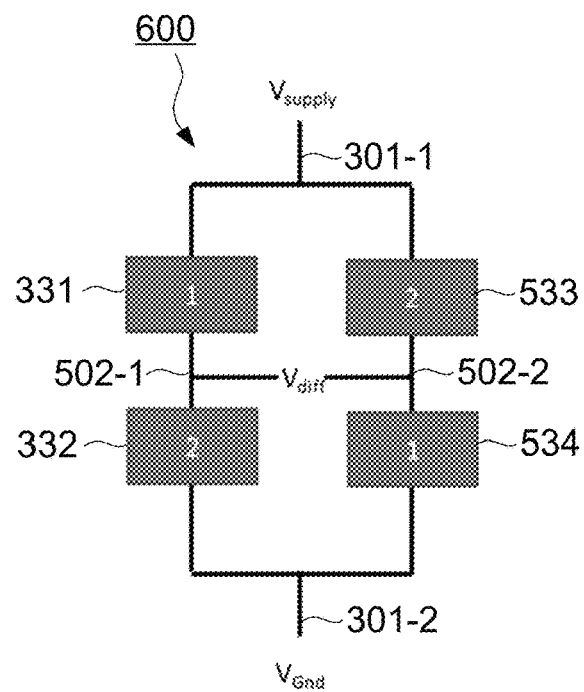
FIG. 6 shows another magnetic sensor bridge circuit.

FIG. 6 shows a magnetic sensor bridge circuit 600 that may be similar to the magnetic sensor bridge circuit 500 of FIG. 5. A first and a fourth magnetoresistive vortex sensor element 331, 534 of the magnetic sensor bridge circuit 600 have the same first resistance transfer function. A second and a third magnetoresistive vortex sensor element 332, 533 have the same second resistance transfer function. Moreover, the base resistance of the first resistance transfer function equals the base resistance of the second resistance transfer function. This common base resistance may, for example, amount to 300Ω (but also other values are generally possible). Furthermore, the sensitivity of the first resistance transfer function equals the sensitivity of the second resistance transfer function. This common sensitivity may, for example, amount to 1 Ω/mT (but also other values are generally possible). Furthermore, the annihilation field strength of the second resistance transfer function may be larger than the annihilation field strength of the first resistance transfer function.

Same base resistances, same sensitivities, but different annihilation field strengths of the first and the second resistance transfer function may be realized by including a respective resistor, whose resistance is unalterable by an imposed magnetic field, in each the first and the fourth magnetoresistive vortex sensor element 331, 534, for example. To this end, the respective resistors can be connected in series to the first and the fourth magnetoresistive vortex sensor element 331, 534. To keep the base resistance constant while adding the (unalterable) resistors, a diameter of at least a respective free layer, a respective tunnel barrier, and a respective reference layer of the first and the fourth magnetoresistive vortex sensor element 331, 534 may be increased. According to FIG. 4, increasing the diameter of the free layer, the tunnel barrier, and the reference layer (e.g., the device diameter of the first and the fourth magnetoresistive vortex sensor element 331, 534) can reduce the annihilation field strength of the first and the fourth magnetoresistive vortex sensor element 331, 534. In this way, the annihilation field strength of the first resistance transfer function may be ±50 mT and the annihilation field strength of the second resistance transfer function may be ±100 mT, for example (but other values are also generally possible).

In the absence of an externally imposed magnetic field, the resistance of the magnetoresistive vortex sensor elements 331, 332, 533, 534 may be equal to the common base resistance (e.g., 300Ω). Hence, the voltage $V_{diff}$ between a common terminal 502-1 of the first and the second magnetoresistive vortex sensor element 331, 332 and a common terminal 502-2 of the third and the fourth magnetoresistive vortex sensor element 533, 534 of the magnetic sensor bridge circuit 600 can be can be equal to zero ($V_{diff}$ corresponds to the voltage $V_M$ of the magnetic sensor bridge circuit 500 of FIG. 5). When an external magnetic field of say 10 mT is applied and imposes the magnetoresistive vortex sensor elements 331, 332, 533, 534, the resistance of each magnetoresistive vortex sensor element may increase by 25 mT*1 Ω/mT=25Ω to 325Ω. This common increase in resistance can leave the voltage $V_{diff}$ unchanged at 0 V.

Suppose now, the external magnetic field is further increased to just slightly below 50 mT, which, in this example, corresponds to the annihilation field strength of the first resistance transfer function. The resistances of the magnetoresistive vortex sensor elements 331, 332, 533, 534 may now amount to 350Ω and the monitored voltage $V_{diff}$ may still be 0 V. Increasing the external magnetic field even further, say to 70 mT, may only increase the resistance of the second and third magnetoresistive vortex sensor element 332, 533 to 370Ω. The resistance of the first and the fourth magnetoresistive vortex sensor element 331, 534 may, however remain at 350Ω, because the first and the fourth magnetoresistive vortex sensor element 331, 534 are in their saturation range due to the external magnetic field exceeding the annihilation field strength of the first resistance transfer function. If a supply voltage of, for instance, 10 V is connected to a first supply terminal 301-2 and ground potential is connected to a second supply terminal 301-2 of the magnetic sensor bridge circuit 600, the voltage $V_{diff}$ may amount to approximately 278 mV. If a predefined threshold of a monitoring circuit of the magnetic sensor bridge circuit 600 is set, for example, to 10 mV, the voltage $V_{diff}$ can exceed this threshold, so that the monitoring circuit may generate an output signal to indicate, that (at least) the first and the fourth magnetoresistive vortex sensor element 331, 534 have gone into their saturation range.

Suppose the nucleation field strength of the first resistance transfer function is 25 mT, for example. When the external magnetic field is, for example, reduced to just above 25 mT, the resistance of the first and the fourth magnetoresistive vortex sensor element 331, 534 may still be 350Ω due to saturation, whereas the resistance of the second and third magnetoresistive vortex sensor element 332, 533 may have reduced to 325Ω due to the second and third magnetoresistive vortex sensor element 332, 533 having not left the linear range. The voltage $V_{diff}$ may then be equal to (approximately) −370 mV and may thus have changed its sign from positive to negative (e.g., the polarity of $V_{diff}$ may be defined as from the common terminal 502-1 to the common terminal 502-2).

When the external magnetic field is reduced to just below the nucleation field strength of the first resistance transfer function (e.g., just below 25 mT), the resistance of the first and the fourth magnetoresistive vortex sensor element 331, 534 may jump to 325Ω in course of a regeneration of a vortex magnetization pattern in the free layer of the first and the fourth magnetoresistive vortex sensor element 331, 534. Hence, the resistance of the first and the fourth magnetoresistive vortex sensor element 331, 534 may be equal again to the resistance of the second and the third magnetoresistive vortex sensor element 332, 533, so that the voltage $V_{diff}$ may jump from (approximately) −370 mV to 0 V. This jump may be detected by the monitoring circuit, so that the monitoring circuit may cease generating its output signal to indicate that the first and the fourth magnetoresistive vortex sensor element 331, 534 (as well as the second and third magnetoresistive vortex sensor element 332, 533) are (again) in the linear range.

It shall further be amended, that when the magnetic field is reduced from above the annihilation field strength of the first resistance transfer function towards the nucleation field strength of the first resistance transfer function, the monitored voltage $V_{diff}$ may decrease below the predefined threshold (e.g., cross 0 V when changing its sign). Nevertheless, the monitoring circuit may still generate its output signal to indicate that (at least) the first and the fourth magnetoresistive vortex sensor element 331, 534 are still in saturation, because the (necessary) condition of a jump of the monitored voltage $V_{diff}$ (in this example a jump by approximately 370 mV) has not been observed yet by the monitoring circuit.

The external magnetic field can be caused by an electric current. A magnitude of this electric current may be derived from measuring its magnetic field. Furthermore, when the electric current increases above a limiting value (e.g., above an absolute maximum rating of an electric component it is supplied to), this may be detected by the magnetic sensor bridge circuit 600 (or by other embodiments, such as the sensor circuit 300 of FIG. 3 and/or the magnetic sensor bridge circuit 500 of FIG. 5) and by adjusting, for example, the annihilation field strength of the first resistance transfer function to the magnetic field caused by the electric current at its limiting value.

For example, the current trend towards electrical vehicles and other high power devices requires the accurate measurement of electric current over a wide range of current values from a few milli-Ampere to a few kilo-Ampere. Numerous examples of power sources exist and are not limited to power grids, generators, transformers, batteries, solar panels, windmills, regenerative braking systems, hydro-electrical or wind-powered generators, or any other form of devices that are capable of providing electrical power to a car-charger where current sensing can be desired.

In addition, such a current sensor (e.g., the sensor circuit 300, the magnetic sensor bridge circuit 500, and/or the magnetic sensor bridge circuit 600) can even be used in battery management systems (e.g., in a vehicle containing batteries and/or an electric motor) and can be used to measure operational current levels (for example, converting the stored energy in the batteries to drive the vehicle) all the way down to a leakage current of the vehicle.

Power converters may include an AC-to-DC converter, a DC-to-DC converter, or a DC-to-AC converter where current measurement can be desired in order to control the power application. Battery applications may include many battery cells linked in a battery network comprises voltages and currents up to a couple of hundreds of Amperes (e.g., 800 A).

In order to be robust against, for example, external homogeneous stray fields a differential setup can be desirable. However, large external fields may shift the operating point outside the linear range, thus causing a reduction of the accuracy of the sensor. A solution for detecting this condition can be required by embodiments of the present disclosure. Even without the presence of disturbance fields an overcurrent (=high field) condition may exist, in which the current may generate a field that is larger than the specified working range of the sensor. It may be valuable information if the sensor itself can detect this condition. As explained above, embodiments of this disclosure can detect this condition. In addition, at least some embodiments can be applied to detect any out of operating range conditions in magnetic field sensors.

At least some embodiments provide on-chip real time overcurrent detection by taking advantage of specific properties of a magnetoresistive sensor based on the vortex scheme (e.g., a magnetoresistive vortex sensor element).

Figure 7A:
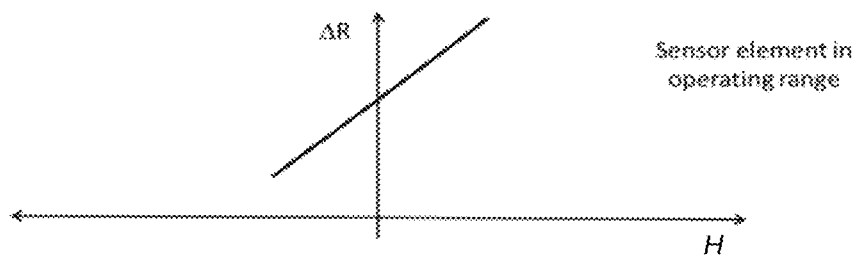
FIG. 7a shows a schematic resistance transfer function of a single resistor element which remains in a vortex state.
Figure 7B:
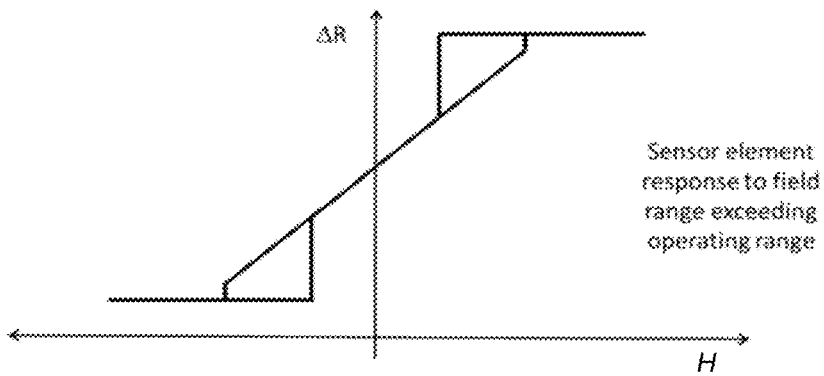
FIG. 7b shows a schematic resistance transfer function of a single resistor element which can be driven out of a vortex state.

FIG. 7a and FIG. 7b show a schematic transfer curve (e.g., a resistance transfer function) of a single resistor element (e.g., a magnetoresistor) which remains in the vortex state (FIG. 7a) and may be driven out of the vortex state (FIG. 7b), respectively, during a field sweep (x-axis is indicating the magnetic field applied).

The critical fields (e.g., the annihilation and/or the nucleation field strength) can be altered (e.g., designed) by material and layout of the sensor element structures (e.g., the magnetoresistors). The relative change of resistance can also depend on a combination of material and layout (e.g., the diameter of the free layer and/or the reference layer of a magnetoresistor). For a given material the total relative resistance change (effect amplitude), may be independent of the layout while the local relative resistance change (e.g., sensitivity) may depend on the layout. According to some examples, for different sensitivities the same absolute resistance change can be generated by adjusting the base resistance of the elements accordingly. Turning back to FIG. 6, consider two types 1 and 2 of sensing resistors (e.g., the first and the fourth magnetoresistive vortex sensor element 331, 533 as type 1 and the second and third magnetoresistive vortex sensor element 332, 534 as type 2) with, for example, different relative sensitivities but identical absolute resistance change per field unit which are arranged in a bridge (e.g., the magnetic sensor bridge circuit 600).

In this case the voltage difference $V_{diff}$ between left and right branch can be zero (since all resistors may change their resistance in the same manner with the field). Consider now that a resistor of type 1 has a certain annihilation field $H_{an1}$ and a nucleation field $H_{n1}$, defined by geometry, for example. This resistor type can have sensitivity $S_1$. For example, this disclosure proposes to combine this resistor now with a resistor of a second type 2 with an annihilation field $H_{an2}$ and a nucleation field $H_{n2}$, defined by geometry. This resistor type can have sensitivity $S_2$. $H_{an2}$ shall be larger than $H_{an1}$. In some examples, $S_2$ may be smaller than $S_1$ in relative terms (in %/mT) but identical in absolute terms (in Ohms/mT). $V_{diff}$ can be zero as long as both resistors type 1 and type 2 are in operating range (e.g., in the linear range). However, as soon as the operating range of resistor type 1 is exceeded (e.g., $H_{ext}>H_{an1}$, e.g., the linear range is left and the saturation range is entered), $V_{diff}$ can be different from zero. This is schematically shown in FIG. 7c.

Figure 7C:
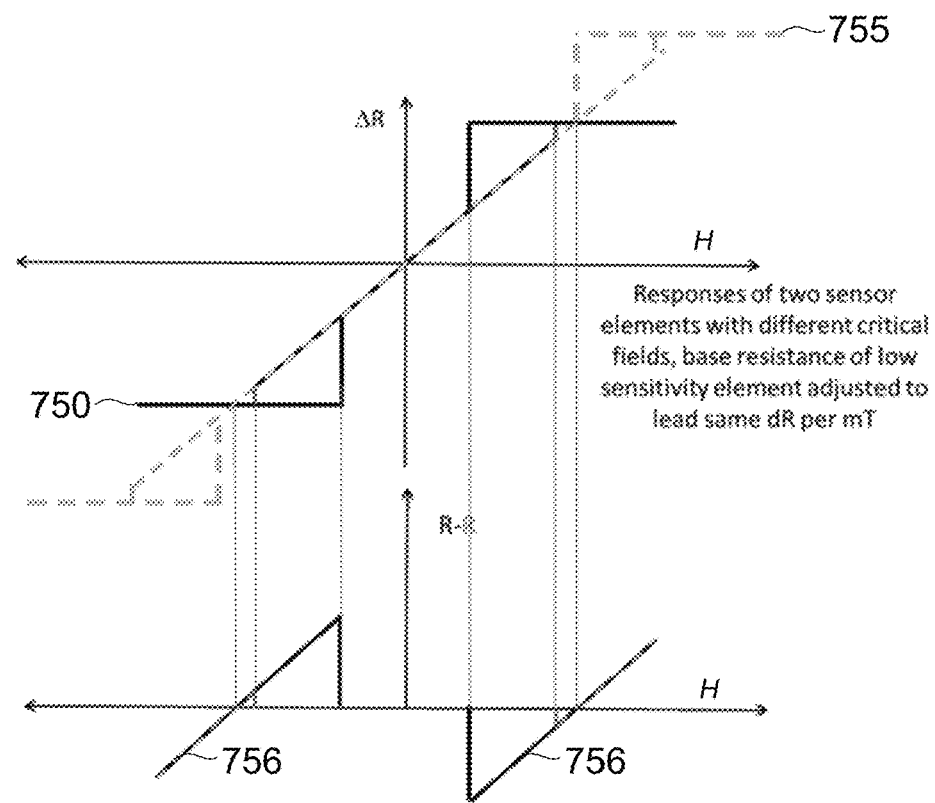
FIG. 7c shows a first and a second resistance transfer function in the upper graph and a difference between the first and the second resistance transfer function in the lower graph.

The upper graph in FIG. 7c displays a first resistance transfer function 750 of the type 1 sensing resistors (e.g., the first and the fourth magnetoresistive vortex sensor element 331, 533 of FIG. 6) and a second resistance transfer function 755 of the type 2 sensing resistors (e.g., the second and the third magnetoresistive vortex sensor element 332, 534 of FIG. 6). The lower graph in FIG. 7c displays the resistance of a resistor of type 2 minus the resistance of a resistor of type 1.

If $H_{ext}$ (e.g., an externally imposed magnetic field) is increased beyond the operating range of resistor type 1, for example, $H_{ext}>H_{an1}$ (e.g., beyond the linear range of resistor type 1), the difference in in resistance 756 between the two types of resistors will deviate from zero (line 756) to positive values on for positive fields and to negative values for negative fields. One can thus define a threshold resistance, or in a differential bridge setup, a threshold voltage at which an overcurrent state can be positively detected. Using this information an appropriate circuitry (e.g., a monitoring circuit) can trigger necessary actions such as emergency shutdown of powerlines and so on. Upon reduction of the external field, the resistance difference 756 can first be negative until the nucleation field $H_{n1}$ can be reached. Below the nucleation field $H_{n1}$ the resistance difference can vanish indicating that the sensor can operate under normal conditions again. An evaluation circuit (or monitoring circuit) can utilize this information to reliably and unambiguously detect the operation state of the sensor (e.g., of the magnetic sensor bridge circuit 600).

Figure 8:
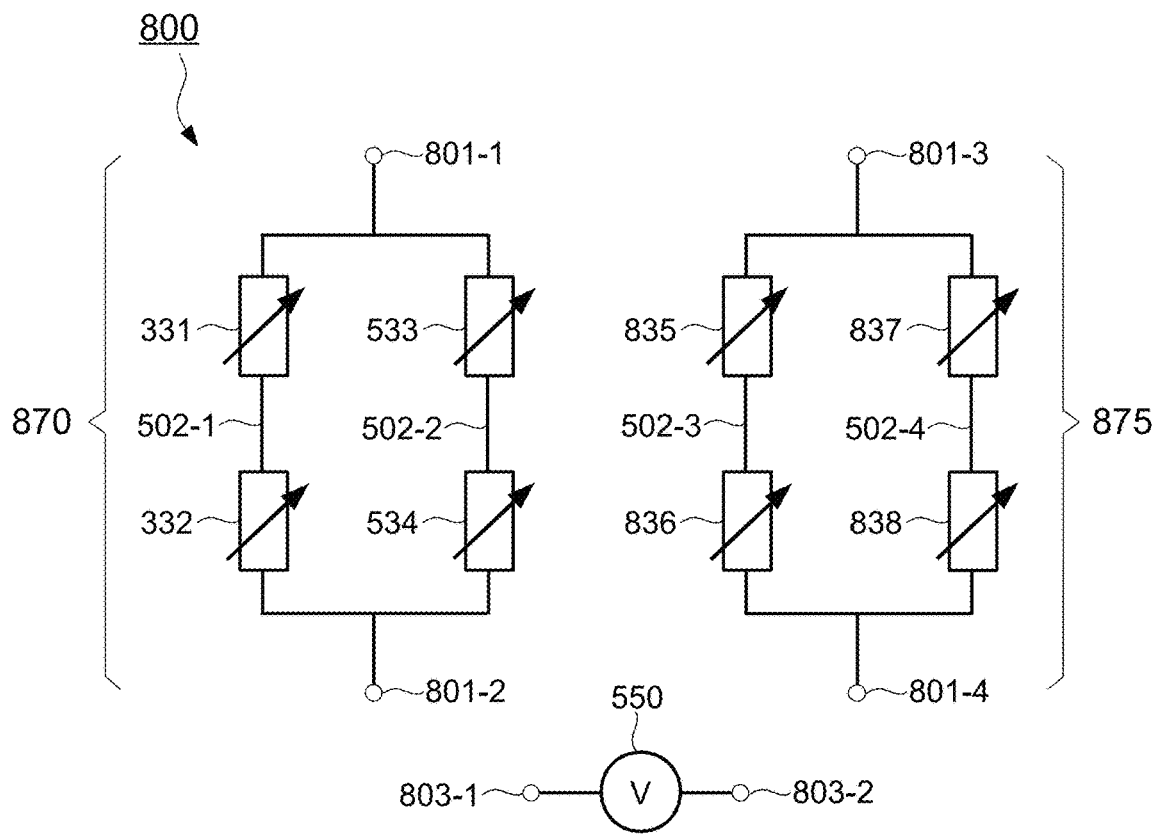
FIG. 8 shows a schematic diagram of a sensor system.

FIG. 8 shows a schematic diagram of a sensor system 800. The sensor system 800 comprises a first magnetic sensor bridge circuit 870. The first magnetic sensor bridge circuit 870 comprises a first magnetoresistive vortex sensor element 331 and a second magnetoresistive vortex sensor element 332. The first and the second magnetoresistive vortex sensor element 331, 332 are connected in series. Furthermore, the first magnetic sensor bridge circuit 870 comprises a third magnetoresistive vortex sensor 533 and a fourth magnetoresistive vortex sensor element 534. The third and the fourth magnetoresistive vortex sensor element 533, 534 are connected in series. The first and the third magnetoresistive vortex sensor element 331, 533 are connected to a first supply terminal 801-1 of the sensor system 800. The second and the fourth magnetoresistive vortex sensor element 332, 534 are connected to a second, different supply terminal 801-2 of the sensor system 800. The first and the fourth magnetoresistive vortex sensor element 331, 534 have a first resistance transfer function with a first saturation range. Moreover, the sensor system 800 comprises a second magnetic sensor bridge circuit 875 located in proximity to the first magnetic sensor bridge circuit 870. The second magnetic sensor bridge circuit 875 comprises a fifth magnetoresistive vortex sensor element 835 and a sixth magnetoresistive vortex sensor element 836. The fifth and the sixth magnetoresistive vortex sensor element 835, 836 are connected in series. Furthermore, the second magnetic sensor bridge circuit 875 comprises a seventh magnetoresistive vortex sensor element 837 and an eighth magnetoresistive vortex sensor element 838. The seventh and the eighth magnetoresistive vortex sensor element 837, 838 are connected in series. The fifth and the seventh magnetoresistive vortex sensor element 835, 837 are connected to a third supply terminal 801-3 of the sensor system 800. The sixth and the eighth magnetoresistive vortex sensor element 836, 838 are connected to a fourth, different supply terminal 801-4 of the sensor system 800. The fifth and the eighth magnetoresistive vortex sensor element 835, 838 have a second resistance transfer function with a second, different saturation range. Moreover, the sensor system 800 comprises a monitoring circuit 550 configured to monitor a voltage between a first test terminal 803-1 and a second test terminal 803-2 of the sensor system 800 and to generate an output signal in case the voltage varies by more than a predefined threshold.

By arranging magnetoresistive vortex sensor elements having different saturation ranges (e.g., different annihilation field strengths) in the different magnetic sensor bridge circuits 870, 875 of the sensor system 800, saturation may first occur in only one of the two magnetic sensor bridge circuits 870, 875, while the other magnetic sensor bridge circuit may still operate its magnetoresistive vortex sensor elements in the linear range and may hence still reliably measure the strength of an externally imposed magnetic field. The monitoring circuit 550 may detect that magnetoresistive vortex sensor elements of one of the magnetic sensor bridge circuits 870, 875 have gone into saturation by monitoring the voltage between the first and the second test terminal and generate an output signal (e.g., a warning signal) indicating that saturation has occurred in one of the magnetic sensor bridge circuits 870, 875, for example. Providing such an output signal may enhance the reliability of operation of the sensor system 800. For example, the sensor system may then trigger other events, such as the shut of power lines causing the high magnetic field by carrying a too high current.

A maximal distance from any one of the first, second, third, or fourth magnetoresistive vortex sensor element 331, 332, 533, 534 to any one of the fifth, sixth, seventh, or eighth magnetoresistive vortex sensor element 835, 836, 837, 838 may smaller than 5 mm (or smaller than 2 mm, or smaller than 1 mm, or smaller than 500 µm, or smaller than 100 µm). This maximal distance can be a lateral distance, if the magnetoresistive vortex sensor elements are arranged laterally next to each other, and/or can also be a vertical distance in case the magnetoresistive vortex sensor elements are arranged vertically above and below each other in a layer stack. For example, the first and the second magnetic sensor bridge circuit 870, 875 can be integrated together with the monitoring circuit 550 into an integrated circuit (e.g., a system-on-chip device), so that the magnetoresistive vortex sensor elements 331, 332, 533, 534, 835, 836, 837, 838 of the first and the second magnetic sensor bridge circuit 870, 875 can be in close proximity to each other. By close proximity of the magnetoresistive vortex sensor elements 331, 332, 533, 534, 835, 836, 837, 838, the strength of the externally imposed magnetic field can be substantially equal at the magnetoresistive vortex sensor element 331, 332, 533, 534, 835, 836, 837, 838, so that when some magnetoresistive vortex sensor elements are driven into their saturation range, other magnetoresistive vortex sensor elements may still be in their linear range.

Respective magnetic free layers of the fifth, sixth, seventh, and eighth magnetoresistive vortex sensor element 835, 836, 837, 838 can have equal thicknesses and equal lateral areas (when neglecting manufacturing tolerances). In this way, the second magnetic sensor bridge circuit 875 can be configured to measure the strength of the externally imposed magnetic field. Moreover, this can provide an equal annihilation field strength (e.g., an equal absolute value of the annihilation field strength) to the fifth, sixth, seventh, and eighth magnetoresistive vortex sensor element 835, 836, 837, 838 so that they may collectively enter the saturation range.

The sixth and the seventh magnetoresistive vortex sensor element 836, 837 can have a resistance transfer function that is inverted with respect to the second resistance transfer function. For example, the resistance transfer function of the sixth and the seventh magnetoresistive vortex sensor element 836, 837 can correspond to the second resistance transfer function mirrored with respect to a resistance axis when the second resistance transfer function is plotted in a graph displaying the resistance of the fifth and eighth magnetoresistive vortex sensor element 835, 838 over the magnetic field. In other words, the resistance transfer function of the sixth and the seventh magnetoresistive vortex sensor element 836, 837 may (substantially) equal the second resistance transfer function but have an inversed polarity for the magnetic field. This way, a resistance of the fifth and eighth magnetoresistive vortex sensor element 835, 838 may increase and a resistance of the sixth and seventh magnetoresistive vortex sensor element 836, 837 may decrease under an externally imposed magnetic field (or vice versa depending on the direction of the magnetic field). This can result in a stronger detuning of the second magnetic sensor bridge circuit 875 and may, for example, let a voltage between a common terminal 502-3 of the fifth and the sixth magnetoresistive vortex sensor element 835, 836 and a common terminal 502-4 of the seventh and the eighth magnetoresistive vortex sensor element 837, 838 vary stronger in response to the externally imposed magnetic field. This voltage may be referred to as the second bridge voltage of the second magnetic sensor bridge circuit 875 (the first bridge voltage being the voltage between a common terminal 502-1 of the first and the second magnetoresistive vortex sensor element 331, 332 and a common terminal 502-2 of the third and the fourth magnetoresistive vortex sensor element 533, 534 of the first magnetic sensor bridge circuit 870). The second bridge voltage can be indicative for the strength of the externally imposed magnetic field (e.g., provide a precise measurement of the magnetic field strength). A stronger variation of the second bridge voltage with the externally imposed magnetic field can enhance the accuracy of magnetic field measurements performed by the second magnetic sensor bridge circuit 875.

Respective reference magnetization patterns of respective magnetic reference layers of the fifth and eighth magnetoresistive vortex sensor element 835, 838 can be parallel with respect to each other and can be antiparallel (e.g., of opposite polarity/direction) with respect to respective reference magnetization patterns of respective magnetic reference layers of the sixth and seventh magnetoresistive vortex sensor element 836, 837. This can result in the sixth and the seventh magnetoresistive vortex sensor element 836, 837 having a resistance transfer function that is inverted with respect to the second resistance transfer function of the fifth and eighth magnetoresistive vortex sensor element 835, 838. Alternatively, the polarity of the externally imposed magnetic field may be inverted at the sixth and seventh magnetoresistive vortex sensor element 836, 837 with respect to the fifth and eighth magnetoresistive vortex sensor element 835, 838. For example, the sixth and seventh magnetoresistive vortex sensor element 836, 837 can be arranged at one side of a current carrying conductor causing the magnetic field, and the fifth and eighth magnetoresistive vortex sensor element 835, 838 can be arranged on the opposite side of the conductor. Reference magnetization patterns of the fifth, sixth, seventh, and eighth magnetoresistive vortex sensor elements 835, 836, 837, 838 may then be parallel.

In some embodiments, the second and the third magnetoresistive vortex sensor element 332, 533 can have a resistance transfer function that is inverted with respect to the first resistance transfer function. In other words, the resistance transfer function of the second and the third magnetoresistive vortex sensor element 836, 837 may (substantially) equal the first resistance transfer function but have an inversed polarity for the magnetic field. This can facilitate using (additionally) the first magnetic sensor bridge circuit 870 to measure the externally imposed magnetic field. For example, the first bridge voltage can be indicative (e.g., proportional) to the strength of the externally imposed magnetic field.

To this end, respective reference magnetization patterns of respective magnetic reference layers of the first and fourth magnetoresistive vortex sensor element 331, 534 can be antiparallel with respect to respective reference magnetization patterns of respective magnetic reference layers of the second and third magnetoresistive vortex sensor element 332, 533.

Furthermore, the respective reference magnetization patterns of the first and fourth magnetoresistive vortex sensor element 331, 534 can be parallel to the respective reference magnetization patterns of the fifth and eighth magnetoresistive vortex sensor element 835, 838 (or alternatively to the respective reference magnetization patterns of the sixth and seventh magnetoresistive vortex sensor element 836, 837).

In this manner, the sensor system 800 can comprise two magnetic sensor bridge circuits 870, 875 that can both measure the strength of the magnetic field, but may be driven into saturation at different field strengths. For example, the fifth, sixth, seventh, and eighth magnetoresistive vortex sensor element 835, 836, 837, 838 may be driven into their saturation range at an annihilation field strength that is at least 1.1 times (or at least 1.5 times, or at least twice, or at least five times) as large as the annihilation field strength of the first, second, third, and fourth magnetoresistive vortex sensor element 331, 332, 533, 534.

A voltage (e.g., a first supply voltage) between the first supply terminal 801-1 and the second supply terminal 801-2 can be different to a voltage (e.g., a second supply voltage) between the third supply terminal 801-3 and the fourth supply terminal 801-4 during operating the sensor system. A ratio of the first and the second supply voltage can be set such that a difference between the first and the second bridge voltage can remain constant while the first, second, third, fourth, fifth, sixth, seventh, and eighth magnetoresistive vortex sensor element 331, 332, 533, 534, 835, 836, 837, 838 are operated in their respective linear ranges. For example, the difference between the first and the second bridge voltage may remain at zero, while the magnetoresistive vortex sensor elements 331, 332, 533, 534, 835, 836, 837, 838 are in the linear range.

During operating the sensor system 800, a voltage of the first test terminal 803-1 can correspond (e.g., be proportional and/or equal) to a voltage (e.g., the first bridge voltage) between the common terminal 502-1 of the first and the second magnetoresistive vortex sensor element 331, 332 and the common terminal 502-2 of the third and the fourth magnetoresistive vortex sensor element 533, 534. A voltage of the second test terminal 803-2 can correspond (e.g., be proportional and/or equal) to a voltage (e.g., the second bridge voltage) between the common terminal 502-3 of the fifth and the sixth magnetoresistive vortex sensor element 835, 836 and a common terminal 502-4 of the seventh and the eighth magnetoresistive vortex sensor 837, 838.

In this way, the monitoring circuit 550 can be configured to monitor the difference between the first and the second bridge voltage and to generate an output signal, when the difference between the first and the second bridge voltage varies from a constant value (e.g., 0 V) by more than a predefined threshold (e.g., by more than 10 mV, or by more than 100 mV, or by more than 1 V). This variation in the difference between the first and the second bridge voltage can be due to the magnetoresistive vortex sensor elements of the first and/or of the second magnetic sensor bridge circuit 870, 875 having been driven into saturation by the externally imposed magnetic field. The output signal of the monitoring circuit may hence be indicative for saturation of the first and/or the second magnetic sensor bridge circuit 870, 875 and/or for the condition that the externally imposed magnetic field has risen above a predefined strength (e.g., above the annihilation field strength of the first and/or the second resistance transfer function).

According to another embodiment, the second and the third magnetoresistive vortex sensor element 332, 533 can have the second resistance transfer function (e.g., the same resistance transfer function as the fifth and the eighth magnetoresistive vortex sensor element 835, 838). Hence, the first magnetic sensor bridge circuit 870 of the sensor system 800 can be similar to the magnetic sensor bridge circuit 500 of FIG. 5. Aspects and features explained in context of the magnetic sensor bridge circuit 500 of FIG. 5 may thus also be applied to the first magnetic sensor bridge circuit 870 of the sensor system 800. For example, a ratio of a base resistance of the second resistance transfer function to a base resistance of the first resistance transfer function can correspond to a ratio of a sensitivity of the second resistance transfer function to a sensitivity of the first resistance transfer function.

The monitoring circuit 550 can then be configured to detect a saturation of the first and the fourth and/or the second and the third magnetoresistive vortex sensor element 331, 332, 533, 534 depending on whether the annihilation field strength of the second resistance transfer function is higher or lower than the annihilation field strength of the first resistance transfer function. The first test terminal of the monitoring circuit can be connected to the common terminal 502-1 of the first and the second magnetoresistive vortex sensor element 331, 332, and the second test terminal 502-2 can be connected to the common terminal of the third and the fourth magnetoresistive vortex sensor element 533, 534.

Additionally, respective reference magnetization patterns of respective magnetic reference layers of the first, second, third and fourth magnetoresistive vortex sensor element 331, 332, 533, 534 can be parallel with respect to each other. The externally imposed magnetic field may then either commonly increase or commonly decrease the resistances of the first, second, third and fourth magnetoresistive vortex sensor element 331, 332, 533, 534 depending on the polarity of the externally imposed magnetic field. Alternatively, the first, second, third and fourth magnetoresistive vortex sensor element 331, 332, 533, 534 can be arranged in such a manner that their respective reference magnetization patterns are either all parallel or all antiparallel to the externally imposed magnetic field. Such an arrangement can, for instance, be implemented when measuring the magnetic field of a current carrying conductor (e.g., a cable), whose general magnetic field distribution (e.g., concentric circles around the conductor) may be known a priori (e.g., calculated from simulation).

The second magnetic sensor bridge circuit 875 comprising the fifth and the eighth magnetoresistive vortex sensor element 835, 838, which have the second resistance transfer function, and the sixth and the seventh magnetoresistive vortex sensor element 836, 837, which can have an inverted version of second resistance transfer function, can be used for measuring the strength of the externally imposed magnetic field. However, if solely this second magnetic sensor bridge circuit 875 was used for measuring the magnetic field, a user of the magnetic sensor bridge circuit 875 and/or additional circuitry connected to the magnetic sensor bridge circuit 875 might not be aware of whether the second magnetic sensor bridge circuit 875 is in the saturation range and may thus deliver inaccurate (or false) measurements of the magnetic field. This is circumvented by providing also the first magnetic sensor bridge circuit 870 which can make it possible to (indirectly) detect saturation and/or approaching saturation of the second magnetic sensor bridge circuit 875 by going itself into saturation.

For example, the annihilation field strength of the second resistance transfer function (and also that of the inverted second resistance transfer function) may be larger than the annihilation field strength of the first resistance transfer function. Thus, the first and the fourth magnetoresistive vortex sensor element 331, 534 of the first magnetic sensor bridge circuit 870 may enter their saturation range before any of the magnetoresistive vortex sensor elements 835, 836, 837, 838 of the second magnetic sensor bridge circuit 875 do. The monitoring circuit 550 can detect the saturation of the first and the fourth magnetoresistive vortex sensor element 331, 534 and generate its output signal. This output signal can hence indicate that the externally imposed magnetic field has risen above the annihilation field strength of the first resistance transfer function and may thus be approaching the annihilation field strength of the second resistance transfer function. That is to say, the monitoring circuit can produce a warning that the second magnetic sensor bridge circuit 875 is approaching saturation.

In another example, the annihilation field strength of the second resistance transfer function (and also the annihilation field strength of the inverted second resistance transfer function) may be smaller than the annihilation field strength of the first resistance transfer function. In this case, the second and third magnetoresistive vortex sensor element 332, 533 may enter their respective saturation range together with the fifth, sixth, seventh, and eighth magnetoresistive vortex sensor element 835, 836, 837, 838 of the second magnetic sensor bridge circuit 875. The monitoring circuit 550 can detect the saturation of the second and the third magnetoresistive vortex sensor element 332, 533 and generate its output signal. This output signal can then also indicate that besides the second and third magnetoresistive vortex sensor element 332, 533 also the fifth, sixth, seventh, and eighth magnetoresistive vortex sensor element 835, 836, 837, 838, are in saturation. Consequently, the output signal can indicate that the second magnetic sensor bridge circuit 875 might not accurately measure the externally imposed magnetic field. After the magnetic field reduces again below the nucleation field strength of the second resistance transfer function, the monitoring circuit can stop generating its output signal to indicate that the magnetic sensor bridge circuit 875 can operate again reliable and deliver accurate measurements of the externally imposed magnetic field.

When generating the output signal, the monitoring circuit may, for example, provide a logic one (e.g., a high logic voltage level such as 1.8 V 3.3 V or 5 V) at an output terminal of the monitoring circuit. When not generating the output signal, the monitoring circuit may, for example, provide a logic zero, for example, a low logic voltage level (e.g., below 0.8 V) at the output terminal of the monitoring circuit.

Figure 9:
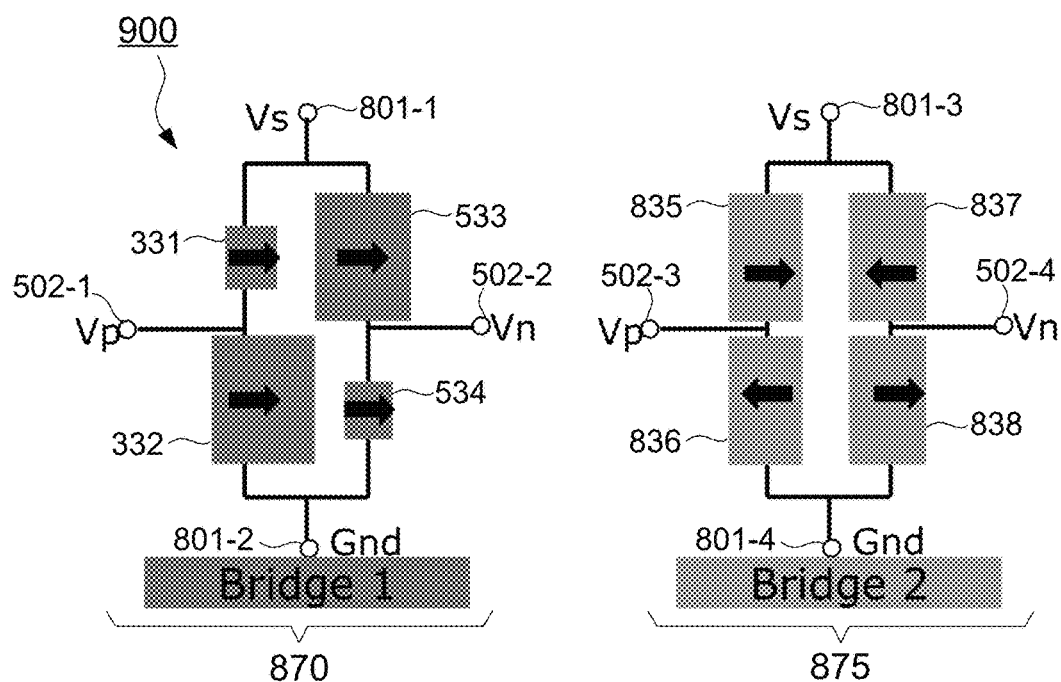
FIG. 9 shows a schematic diagram of another sensor system.

FIG. 9 shows a schematic diagram of another sensor system 900. The sensor system 900 can be similar to the sensor system 800 of FIG. 8. A first, second, third, and fourth magnetoresistive vortex sensor element 331, 332, 533, 534 of a first magnetic sensor bridge circuit 870 of the sensor system 900 comprise respective magnetic reference layers having a parallel reference magnetization with respect to each other. The first and the fourth magnetoresistive vortex sensor element 331, 534 have a first resistance transfer function and the second and the third magnetoresistive vortex sensor element 331, 533 have a second different resistance transfer function that may have a different saturation region (e.g., a different annihilation field strength) than the first resistance transfer function.

A second magnetic sensor bridge circuit 875 of the sensor system 900 comprises a fifth and an eighth magnetoresistive vortex sensor element 835, 838 with respective reference layers having a parallel reference magnetization with respect to each other and with respect to those of the magnetoresistive vortex sensor elements 331, 332, 533, 534 of the first magnetic sensor bridge circuit 870. Furthermore, the second magnetic sensor bridge circuit 875 comprises a sixth and a seventh magnetoresistive vortex sensor element 836, 837 with respective reference layers having a parallel reference magnetization with respect to each other and antiparallel with respect to those of the fifth and the eighth magnetoresistive vortex sensor element 835, 838. The fifth and the eighth magnetoresistive vortex sensor element 835, 838 have a third resistance transfer function and the sixth and the seventh magnetoresistive vortex sensor element 836, 837 have a resistance transfer function that is inverted with respect to the third resistance transfer function.

The first magnetic sensor bridge circuit 870 can be referred to as control bridge. The second magnetic sensor bridge circuit 875 can be referred to as sensing bridge. A back bias magnet can be attached to the sensor system 900 such that both bridge circuits 870, 875 are exposed to the magnetic field of the back bias magnet.

The saturation range of the third resistance transfer function may be different to both the respective saturation ranges of the first and the second resistance function. For example, an annihilation field strength of the third resistance transfer function may lie between the annihilation field strength of the first resistance transfer function and the annihilation field strength of the second resistance transfer function. Optionally, the annihilation field strength of at least the first resistance transfer function may be even below the nucleation field strength of the third resistance transfer function. In this way, the first and the fourth magnetoresistive vortex sensor element 331, 534 may go into saturation at a weaker externally imposed magnetic field than the magnetoresistive vortex sensor elements 833, 834, 835, 836 of the second magnetic sensor bridge circuit 875. Thus, the control bridge 870 may be used to warn that the operating conditions of the sensing bridge 875 are approaching the limits of its operating range.

According to an example, an annihilation field strength of the third resistance transfer function may (substantially) equal the annihilation field strength of the first resistance transfer function while the annihilation field strength of the second resistance transfer function may be larger than that of the first resistance transfer function. The sensor (e.g., the second magnetic sensor bridge circuit 875) may then have a relatively high sensitivity to detect low fields. Furthermore, a measure of the overcurrent (e.g., a current causing the magnetic field) can be obtained from the resistance difference.

According to another example, an annihilation field strength of the third resistance transfer function may (substantially) equal the annihilation field strength of the second resistance transfer function, while the annihilation field strength of the second resistance transfer function may be larger than that of the first resistance transfer function. The sensor (e.g., the second magnetic sensor bridge circuit 875) may then have a relatively low sensitivity, but the resistance difference may be used to warn that the operating conditions are approaching the limits of the operating range.

In another example, the annihilation field strength of the third resistance transfer function may lie above the annihilation field strengths of both the first resistance transfer function and the annihilation field strength of the second resistance transfer function. Optionally, the annihilation field strengths of the first and/or the second resistance transfer function may be below the nucleation field strength of the third resistance transfer function. In this way the magnetoresistive vortex sensor elements of the control bridge 870 may go into saturation at a weaker externally imposed magnetic field than the magnetoresistive vortex sensor elements of the sensing bridge 875. Also, the control bridge 870 may be used to warn even more defensively that the operating conditions of the sensing bridge 875 are approaching the limits of its operating range.

By selecting the dimension of at least a part of the control bridge vortex sensors in such a way that their annihilation field is approximately equal or smaller than the nucleation field of the sensing bridge vortex sensors it may be possible to monitor reliably the application conditions. For example, upon assembly of the sensing bridge with a back bias magnet, the control bridge may give immediate information (e.g., to a user) about whether the static field applied by the back bias magnet exceeds the reliable operating range.

According to some examples, a number of different vortex sensors can be combined in the presented way to evaluate field amplitudes and categorize them in field classes.

For example, the second magnetic sensor bridge circuit (sensing bridge) 875 may be employed for normal detection of magnetic fields and may comprise one type of resistor with TMR (Tunnel Magneto-Resistive) cells of a certain diameter $D_2$. The first magnetic sensor bridge circuit 870 may be employed for overfield detection (e.g., for detection of magnetic fields causing saturation to the first and/or the second magnetic sensor bridge circuit 870, 875). The first magnetic sensor bridge circuit (control bridge) 870 may comprise two types of resistors: A type A with resistors like those used in the second magnetic sensor bridge circuit 875 and having a relative sensitivity of $S_x$ (in %/mT), and a type B with TMR cells of a diameter $D_1$ different to the diameter $D_2$ and having a relative sensitivity of $S_y$ (in %/mT). A base resistance of each resistor may be chosen according to $R_B = R_B * S_x/S_y$. For example, a ratio of the base resistance of a type A resistor to the base resistance of type B resistor may correspond to (e.g., be equal to) a ratio of the relative sensitivity of the type A resistor to the relative sensitivity of the type B resistor. The relative sensitivity may denote a change in resistance of a type A or B resistor relative to its base resistance for a given magnetic field variation.

Moreover, a first and a third supply terminal 801-1, 801-3 of the sensor system 900 can be connected to a common supply voltage $V_s$. The common supply voltage $V_s$ may, for example, be a fixed DC voltage between 1 V and 10 V. A second and a fourth supply terminal 801-2, 801-4 of the sensor system 900 can be connected to ground. Hence, the first and the second magnetic sensor bridge circuit 870, 875 may be subjected to the same supply voltage.

Figure 10:
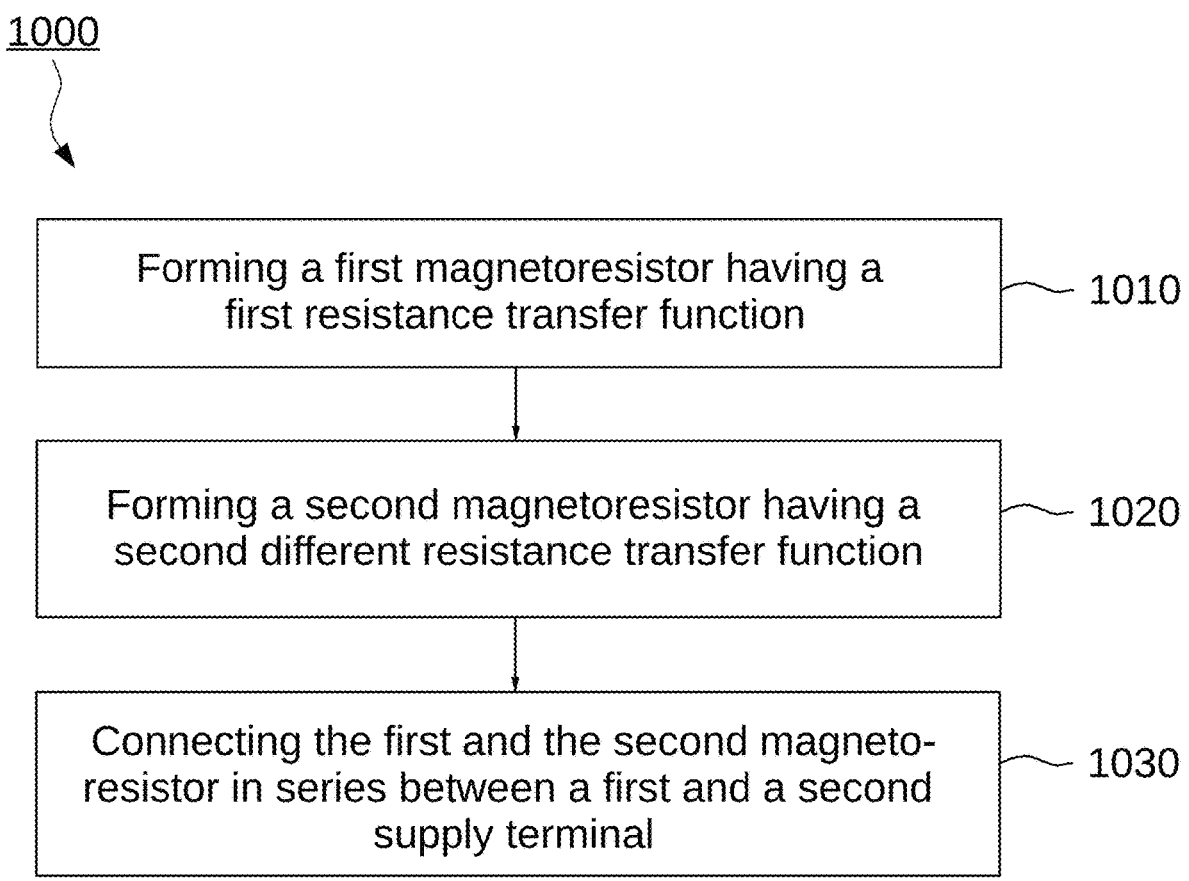
FIG. 10 shows a flow chart of a method for forming a sensor circuit.

FIG. 10 shows a flow chart of a method 1000 for forming a sensor circuit. The method 1000 comprises forming 1010 a first magnetoresistor having a first resistance transfer function. Furthermore, the method 1000 comprises forming 1020 a second magnetoresistor having a second different resistance transfer function. Furthermore, the method 1000 comprises connecting 1030 the first and the second magnetoresistor in series between a first and a second supply terminal of the sensor circuit.

By forming 1010, 1020 the first and the second magnetoresistors of different resistance transfer functions (e.g., having different saturation regions with different absolute values of annihilation field strengths) and connecting 1030 them in series between the first and the second supply terminal of the sensor circuit, a voltage across the first and/or the second magnetoresistor may vary in response to an external magnetic field imposing on the first and the second magnetoresistors during operating the sensor circuit. The voltage across the first and/or the second magnetoresistor may then be indicative for the strength and/or the direction of the magnetic field. For example, during operating the sensor device, the first supply terminal can be connected to a supply voltage and the second terminal can be connected to ground (or vice versa).

Additionally, the first and the second magnetoresistor can be formed from a common layer stack of ferromagnetic and non-ferromagnetic layers on a common substrate. This can bring the first and the second magnetoresistor into close proximity to each other. For example, a maximal distance between the first and the second magnetoresistor can be smaller than 5 mm (or smaller than 2 mm, or smaller than 1 mm, or smaller than 500 µm, or smaller than 100 µm). The strength of the externally imposing magnetic field may then be (substantially) equal at the first and the second magnetoresistor.

Moreover, when forming the first and the second magnetoresistor from a common layer stack of ferromagnetic and non-ferromagnetic layers on a common substrate, the first and the second magnetoresistor can be subjected to the same manufacturing tolerances. This can enable that a ratio of a base resistance of the second resistance transfer function to a base resistance of the first resistance transfer function can correspond (e.g., be substantially equal) to a ratio of a sensitivity of the second resistance transfer function to a sensitivity of the first resistance transfer function.

Forming the first magnetoresistor can further comprise forming a magnetic free layer of the first magnetoresistor with at least one dimension differing from a corresponding dimension of the second magnetoresistor. This can result in the first resistance transfer function being different from the second resistance transfer function, for example, in terms of base resistance, sensitivity, annihilation field strength and/or nucleation field strength as explained in the context of FIG. 4. For example, a dimension (e.g., a thickness, a diameter, and/or a lateral area) of the magnetic free layer of the first magnetoresistor 331 can differ from the corresponding dimension of the magnetic free layer of the second magnetoresistor 332 by at least a factor of 1.1 (or at least a factor of 1.5, or at least a factor of 2, or at least a factor of 5) and/or at most by a factor of 20 (or at most by a factor of 10).

Some examples of the present disclosure relate to devices and methods for detection of overfield conditions and valid operating range in magnetic field sensors using vortex xMR devices. To this end, the specific properties of vortex states in magnetoresistive structures can be used to detect exposure to high (magnetic) fields, for example, generated by currents. For example, means can be provided to detect overcurrent or field class information as a direct voltage value which can be readily used by an electric system, thus enabling the manufacturer, owner, or user of the system to save costs and provide protection to his system. For example, some embodiments of the present disclosure may be used in current sensors for overcurrent detection in speed sensors for airgap detection.

Other examples may require additional effort in terms of chip size and circuit design to detect the overcurrent state. In addition, response times in the microsecond (μs) range may be common.

For example, an overcurrent detection scheme may employ an operational amplifier together with a comparator. This can provide a low cost and easily configurable solution that enables both overcurrent detection and current monitoring. The response time may be down to as low as 1 μs. However, multiple chips can require large footprint and/or board space. Furthermore, measurement accuracy and temperature stability can be lower. Increasing measurement precision can require expensive precision amplifiers and resistors.

Another overcurrent detection scheme may employ a current sense amplifier together with a comparator. This can enable both overcurrent detection and current monitoring with a response time down to as low as 2 μs. However, also in this approach multiple chips can require large footprint and/or board space. Furthermore, a precise external reference for precision threshold setting may be required.

Yet another example of an overcurrent detection scheme may employ an integrated overcurrent detector with a small footprint saving greater than 50% (of board space) compared to a discrete op-amp solution. An integrated precision reference can set a threshold trip point via a single external resistor. This scheme might however not report a current value.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as a "means for" performing a certain function may refer to a circuit that is configured to perform a certain function. Hence, a "means for" may be implemented as a "means configured to or suited for" such as a device or a circuit configured to or suited for the respective task.

Functions of various elements shown in the figures, including any functional blocks labeled as "means," "means for providing a sensor signal," and "means for generating a transmit signal" may be implemented in the form of dedicated hardware, such as "a signal provider," "a signal processing unit," "a processor," and "a controller," as well as hardware capable of executing software in association with appropriate software. When provided by a processor, the functions may be provided by a single dedicated processor, by a single shared processor, or by a plurality of individual processors, some of which or all of which may be shared. However, the terms "processor" or "controller" are not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, sub-functions, sub-processes, sub-operations or sub-steps, respectively. Such sub-acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that although a dependent claim may refer in the claims to a specific combination with one or more other claims, other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A sensor circuit, comprising:
a first magnetoresistor having a first resistance transfer function, the first magnetoresistor comprising a first magnetic free layer configured to spontaneously generate a first vortex magnetization pattern in the first magnetic free layer, and a first magnetic reference layer having a first straight reference magnetization pattern;
a second magnetoresistor having a second, different, resistance transfer function, the second magnetoresistor comprising a second magnetic free layer configured to spontaneously generate a second vortex magnetization pattern in the second magnetic free layer, and a second magnetic reference layer having a second straight reference magnetization pattern,
wherein the first magnetoresistor and the second magnetoresistor are connected, by a common node, in series between a first supply terminal and a second supply terminal of the sensor circuit, and
wherein an annihilation field strength for removing the first vortex magnetization pattern in the first magnetic free layer of the first magnetoresistor is different from an annihilation field strength for removing the second vortex magnetization pattern in the second magnetic free layer of the second magnetoresistor; and
a monitoring circuit configured to monitor a monitored voltage as a voltage difference between the common node and a reference node and configured to generate a warning signal based on the monitored voltage and a reference voltage, wherein the warning signal indicates that at least one of the first magnetoresistor and the second magnetoresistor is in saturation,
wherein the monitoring circuit is configured to generate the warning signal when the monitored voltage deviates by more than a predefined threshold amount from the reference voltage and maintain the warning signal until a signal turn-off condition is satisfied,
wherein, while the warning signal is not being generated by the monitoring circuit, the monitoring circuit is configured to continue to not generate the warning signal when the monitored voltage does not deviate by more than the predefined threshold amount from the reference voltage,
wherein, while the warning signal is being generated by the monitoring circuit, the monitoring circuit is configured to cease generating the warning signal only when the signal turn-off condition is satisfied,
wherein the monitoring circuit is configured to monitor for a discontinuous voltage jump in the monitored voltage and determine that the signal turn-off condition is satisfied only when the discontinuous voltage jump is detected,
wherein the discontinuous voltage jump is a discontinuous change in the monitored voltage from a saturation voltage value to being equal to the reference voltage without the monitored voltage being equal to any intermediate voltage between the saturation voltage value and the reference voltage,
wherein the saturation voltage value is a voltage value generated as the monitored voltage when at least one of the first magnetoresistor and the second magnetoresistor is in saturation and differs from the reference voltage by an amount greater than the predefined threshold amount,
wherein, while the warning signal is being generated by the monitoring circuit, the monitoring circuit is configured to maintain the warning signal despite the monitored voltage not deviating by more than the predefined threshold amount from the reference voltage if the discontinuous voltage jump is not detected by the monitoring circuit, and
wherein the reference voltage is 0V.

2. The sensor circuit of claim 1, wherein the first resistance transfer function and the second resistance transfer function each comprise a respective linear range and a respective saturation range, wherein respective transitions from the linear range to the saturation range of the first transfer function and the second resistance transfer function occur at different strengths of an externally imposed magnetic field.

3. The sensor circuit of claim 2, wherein, for a given variation of the externally imposed magnetic field:
a first resistance variation of the first magnetoresistor, while operating in a first linear range of the first resistance transfer function, is induced according to a first factor relative to a first base resistance of the first magnetoresistor, and
a second resistance variation of the second magnetoresistor, while operating in a second linear range of the second resistance transfer function, is induced according to a second factor relative to a second base resistance of the second magnetoresistor, wherein the first factor is the same as the second factor,
wherein the first base resistance denotes a resistance at which no externally imposed magnetic field is applied to the first magnetoresistor,
wherein the second base resistance denotes a resistance at which no externally imposed magnetic field is applied to the second magnetoresistor, and
wherein a ratio of the second base resistance to the first base resistance is substantially equal to a ratio of a sensitivity of the second resistance transfer function to a sensitivity of the first resistance transfer function, wherein the second base resistance is equal to a product of the first base resistance and a constant factor, the constant factor being different than a value of 1.

4. The sensor circuit of claim 1, wherein a dimension of the first magnetic free layer of the first magnetoresistor is different than a corresponding dimension of the second magnetic free layer of the second magnetoresistor.

5. The sensor circuit of claim 1, wherein the sensor circuit is a bridge circuit, and wherein a first branch of the bridge circuit comprises the first magnetoresistor and the second magnetoresistor.

6. The sensor circuit of claim 5, further comprising:
a second branch, the second branch comprising a third magnetoresistor having a third resistance transfer function and a fourth magnetoresistor having a fourth resistance transfer function different from the third resistance transfer function, wherein the third magnetoresistor and the fourth magnetoresistor are connected, by the reference node, in series between the first and the second supply terminal of the sensor circuit.

7. The sensor circuit of claim 1, wherein:
the monitored voltage is zero in response to the first magnetoresistor and the second magnetoresistor each operating in a respective linear range, and
the monitored voltage is non-zero in response to at least one of the first magnetoresistor and the second magnetoresistor operating in a respective saturation range.

8. The sensor circuit of claim 7, wherein the monitored voltage remains constant, at zero, while the first magnetoresistor and the second magnetoresistor each vary within the respective linear range.

9. The sensor circuit of claim 1, wherein, in response to generating the warning signal, the monitoring circuit is configured to shut off a current source that generates an externally imposed magnetic field being detected by the sensor circuit.

10. A magnetic sensor bridge circuit, comprising:
a first magnetoresistive vortex sensor element and a second magnetoresistive vortex sensor element connected in series;
a third magnetoresistive vortex sensor element and a fourth magnetoresistive vortex sensor element connected in series,
wherein the first magnetoresistive vortex sensor element and the third magnetoresistive vortex sensor element are connected to a first supply terminal of the magnetic sensor bridge circuit,
wherein the second magnetoresistive vortex sensor element and the fourth magnetoresistive vortex sensor element are connected to a second, different, supply terminal of the magnetic sensor bridge circuit,
wherein the first magnetoresistive vortex sensor element and the fourth magnetoresistive vortex sensor element have a first resistance transfer function with a first annihilation field strength for removing a vortex magnetization pattern in a magnetic free layer of the first magnetoresistive vortex sensor element and removing a vortex magnetization pattern in a magnetic free layer of the fourth magnetoresistive vortex sensor element, and
wherein the second magnetoresistive vortex sensor element and the third magnetoresistive vortex sensor element have a second resistance transfer function with a second annihilation field strength for removing a vortex magnetization pattern in a magnetic free layer of the second magnetoresistive vortex sensor element and removing a vortex magnetization pattern in a magnetic free layer of the third magnetoresistive vortex sensor element, wherein the first resistance transfer function and the second resistance transfer function are different from each other, and the first annihilation field strength and the second annihilation field strength are different from each other; and
a monitoring circuit configured to monitor a voltage between a first common terminal of the first magnetoresistive vortex sensor element and the second magnetoresistive vortex sensor element and a second common terminal of the third magnetoresistive vortex sensor element and the fourth magnetoresistive vortex sensor element, and configured to generate a warning signal based on the monitored voltage and a reference voltage, wherein the warning signal indicates that at least one of the first, the second, the third, and the fourth magnetoresistive vortex sensor element is in saturation,
wherein the monitoring circuit is configured to generate the warning signal when the monitored voltage deviates by more than a predefined threshold amount from the reference voltage and maintain the warning signal until a signal turn-off condition is satisfied,
wherein, while the warning signal is not being generated by the monitoring circuit, the monitoring circuit is configured to continue to not generate the warning signal when the monitored voltage does not deviate by more than the predefined threshold amount from the reference voltage,
wherein, while the warning signal is being generated by the monitoring circuit, the monitoring circuit is configured to cease generating the warning signal only when the signal turn-off condition is satisfied,
wherein the monitoring circuit is configured to monitor for a discontinuous voltage jump in the monitored voltage and determine that the signal turn-off condition is satisfied only when the discontinuous voltage jump is detected,
wherein the discontinuous voltage jump is a discontinuous change in the monitored voltage from a saturation voltage value to being equal to the reference voltage without the monitored voltage being equal to any intermediate voltage between the saturation voltage value and the reference voltage,
wherein the saturation voltage value is a voltage value generated as the monitored voltage when at least one of the first magnetoresistor and the second magnetoresistor is in saturation and differs from the reference voltage by an amount greater than the predefined threshold amount,
wherein, while the warning signal is being generated by the monitoring circuit, the monitoring circuit is configured to maintain the warning signal despite the monitored voltage not deviating by more than the predefined threshold amount from the reference voltage if the discontinuous voltage jump is not detected by the monitoring circuit, and
wherein the reference voltage is 0V.

11. The magnetic sensor bridge circuit of claim 10, wherein an annihilation field strength of the second resistance transfer function is at least 1.1 times larger than an annihilation field strength of the first resistance transfer function.

12. The magnetic sensor bridge circuit of claim 10, wherein a ratio of a base resistance of the second resistance transfer function to a base resistance of the first resistance transfer function corresponds to a ratio of a sensitivity of the second resistance transfer function to a sensitivity of the first resistance transfer function.

13. The magnetic sensor bridge circuit of claim 10, wherein a base resistance of the second resistance transfer function is equal to the base resistance of the first resistance transfer function.

14. The magnetic sensor bridge circuit of claim 10, wherein:
the monitored voltage is zero in response to the first magnetoresistive vortex sensor element, the second magnetoresistive vortex sensor element, the third magnetoresistive vortex sensor element, and the fourth magnetoresistive vortex sensor each operating in a respective linear range, and
the monitored voltage is non-zero in response to at least one of the first magnetoresistive vortex sensor element, the second magnetoresistive vortex sensor element, the third magnetoresistive vortex sensor element, and the fourth magnetoresistive vortex sensor operating in a respective saturation range.

15. The magnetic sensor bridge circuit of claim 10, wherein:
the warning signal indicates that at least one of the first magnetoresistive vortex sensor element, the second magnetoresistive vortex sensor element, the third magnetoresistive vortex sensor element, and the fourth magnetoresistive vortex sensor is operating in a respective saturation range, and
an absence of the warning signal indicates that the first magnetoresistive vortex sensor element, the second magnetoresistive vortex sensor element, the third magnetoresistive vortex sensor element, and the fourth magnetoresistive vortex sensor are each operating in a respective linear range.

16. The magnetic sensor bridge circuit of claim 10, wherein, in response to generating the warning signal, the monitoring circuit is configured to shut off a current source that generates an externally imposed magnetic field being detected by the magnetic sensor bridge circuit.

17. The magnetic sensor bridge circuit of claim 10, wherein the predefined threshold amount is at least 10 mV.

18. The magnetic sensor bridge circuit of claim 10, wherein:
the monitored voltage remains at the reference voltage that is independent of an externally imposed magnetic field, while the first and the fourth magnetoresistors operate in a linear range of the first resistance transfer function and while the second and the third magnetoresistors operates in a linear range of the second resistance transfer function,
the monitored voltage deviates from the reference voltage by an amount dependent on the externally imposed magnetic field, while at least one of the first or the fourth magnetoresistor operates in a saturation region of the first resistance transfer function or while at least one of the second or the third magnetoresistor operates in a saturation region of the second resistance transfer function.

19. A sensor system, comprising:
a first magnetic sensor bridge circuit comprising a first magnetoresistive vortex sensor element and a second magnetoresistive vortex sensor element connected in series and a third magnetoresistive vortex sensor element and a fourth magnetoresistive vortex sensor element connected in series, wherein the first magnetoresistive vortex sensor element and the third magnetoresistive vortex sensor element are connected to a first supply terminal of the sensor system, wherein the second magnetoresistive vortex sensor element and the fourth magnetoresistive vortex sensor element are connected to a second, different, supply terminal of the sensor system, and wherein the first magnetoresistive vortex sensor element and the fourth magnetoresistive vortex sensor element have a first resistance transfer function with a first annihilation field strength for removing a vortex magnetization pattern in a magnetic free layer of the first magnetoresistive vortex sensor element and removing a vortex magnetization pattern in a magnetic free layer of the fourth magnetoresistive vortex sensor element;
a second magnetic sensor bridge circuit located in proximity to the first magnetic sensor bridge circuit and comprising a fifth magnetoresistive vortex sensor element and a sixth magnetoresistive vortex sensor element connected in series and a seventh magnetoresistive vortex sensor element and an eighth magnetoresistive vortex sensor element connected in series, wherein the fifth magnetoresistive vortex sensor element and the seventh magnetoresistive vortex sensor element are connected to a third supply terminal of the sensor system, wherein the sixth magnetoresistive vortex sensor element and the eighth magnetoresistive vortex sensor element are connected to a fourth, different, supply terminal of the sensor system, and wherein the fifth magnetoresistive vortex sensor element and the eighth magnetoresistive vortex sensor element have a second resistance transfer function with a second annihilation field strength for removing a vortex magnetization pattern in a magnetic free layer of the fifth magnetoresistive vortex sensor element and removing a vortex magnetization pattern in a magnetic free layer of the eighth magnetoresistive vortex sensor element, wherein the first resistance transfer function and the second resistance transfer function are different from each other, and the first annihilation field strength and the second annihilation field strength are different from each other; and
a monitoring circuit configured to monitor a voltage between a first test terminal and a second test terminal of the sensor system, and configured to generate a warning signal based on the monitored voltage and a reference voltage, wherein the warning signal indicates that at least one of the first, the second, the third, the fourth, the fifth, the sixth, the seventh, and the eight magnetoresistive vortex sensor element is in saturation,
wherein the monitoring circuit is configured to generate the warning signal when the monitored voltage deviates by more than a predefined threshold amount from the reference voltage and maintain the warning signal until a signal turn-off condition is satisfied,
wherein, while the warning signal is not being generated by the monitoring circuit, the monitoring circuit is configured to continue to not generate the warning signal when the monitored voltage does not deviate by more than the predefined threshold amount from the reference voltage,
wherein, while the warning signal is being generated by the monitoring circuit, the monitoring circuit is configured to cease generating the warning signal only when the signal turn-off condition is satisfied,
wherein the monitoring circuit is configured to monitor for a discontinuous voltage jump in the monitored voltage and determine that the signal turn-off condition is satisfied only when the discontinuous voltage jump is detected,
wherein the discontinuous voltage jump is a discontinuous change in the monitored voltage from a saturation voltage value to being equal to the reference voltage without the monitored voltage being equal to any intermediate voltage between the saturation voltage value and the reference voltage,
wherein the saturation voltage value is a voltage value generated as the monitored voltage when at least one of the first magnetoresistor and the second magnetoresistor is in saturation and differs from the reference voltage by an amount greater than the predefined threshold amount,
wherein, while the warning signal is being generated by the monitoring circuit, the monitoring circuit is configured to maintain the warning signal despite the monitored voltage not deviating by more than the predefined threshold amount from the reference voltage if the discontinuous voltage jump is not detected by the monitoring circuit, and wherein the reference voltage is 0V.

20. The sensor system of claim 19, wherein a maximal distance from any one of the first magnetoresistive vortex sensor element, second magnetoresistive vortex sensor element, third magnetoresistive vortex sensor element, or fourth magnetoresistive vortex sensor element to any one of the fifth magnetoresistive vortex sensor element, sixth magnetoresistive vortex sensor element, seventh magnetoresistive vortex sensor element, or eighth magnetoresistive vortex sensor element is smaller than 5 mm.

21. The sensor system of claim 19, wherein the sixth magnetoresistive vortex sensor element and the seventh magnetoresistive vortex sensor element have a resistance transfer function that is inverted with respect to the second resistance transfer function.

22. The sensor system of claim 19, wherein the second magnetoresistive vortex sensor element and the third magnetoresistive vortex sensor element have a resistance transfer function that is inverted with respect to the first resistance transfer function.

23. The sensor system of claim 22, wherein:

a voltage of the first test terminal corresponds to a voltage between a common terminal of the first magnetoresistive vortex sensor element and the second magnetoresistive vortex sensor element and a common terminal of the third magnetoresistive vortex sensor element and the fourth magnetoresistive vortex sensor element, and a voltage of the second test terminal corresponds to a voltage between a common terminal of the fifth magnetoresistive vortex sensor element and the sixth magnetoresistive vortex sensor element and a common terminal of the seventh magnetoresistive vortex sensor element and the eighth magnetoresistive vortex sensor element.

24. The sensor system of claim 22, wherein a voltage between the first supply terminal and the second supply terminal is different than a voltage between the third supply terminal and the fourth supply terminal during operating the sensor system.

25. The sensor system of claim 19, wherein the second magnetoresistive vortex sensor element and the third magnetoresistive vortex sensor element have the second resistance transfer function.

26. The sensor system of claim 25, wherein the first test terminal is connected to a common terminal of the first magnetoresistive vortex sensor element and the second magnetoresistive vortex sensor element, wherein the second test terminal is connected to a common terminal of the third magnetoresistive vortex sensor element and the fourth magnetoresistive vortex sensor element.

27. The sensor system of claim 25, wherein respective reference magnetization patterns of respective magnetic reference layers of the first magnetoresistive vortex sensor element, second magnetoresistive vortex sensor element, third magnetoresistive vortex sensor element, and fourth magnetoresistive vortex sensor element are parallel with respect to each other.

* * * * *